United States Patent [19]
Shimizu et al.

[11] Patent Number: 5,945,994
[45] Date of Patent: Aug. 31, 1999

[54] KINEMATIC-SIMULATION APPARATUS AND KINEMATIC-SIMULATION METHOD WITH INTERFERENCE PROCESSING

[75] Inventors: Kazuma Shimizu, Kashiwa; Naoki Iwamoto, Yokohama; Mari Nomura, Tokyo, all of Japan

[73] Assignee: Canon Kabushiki Kaisha, Tokyo, Japan

[21] Appl. No.: 08/444,358

[22] Filed: May 18, 1995

Related U.S. Application Data

[63] Continuation of application No. 07/965,757, Oct. 23, 1992, abandoned.

[30] Foreign Application Priority Data

| Oct. 24, 1991 | [JP] | Japan | 3-277880 |
| Oct. 24, 1991 | [JP] | Japan | 3-277881 |
| Oct. 24, 1991 | [JP] | Japan | 3-277882 |
| Oct. 24, 1991 | [JP] | Japan | 3-277883 |
| Oct. 24, 1991 | [JP] | Japan | 3-277884 |
| Oct. 24, 1991 | [JP] | Japan | 3-277885 |
| Oct. 24, 1991 | [JP] | Japan | 3-277886 |
| Oct. 24, 1991 | [JP] | Japan | 3-277890 |
| Oct. 24, 1991 | [JP] | Japan | 3-277891 |
| Oct. 24, 1991 | [JP] | Japan | 3-277892 |
| Oct. 24, 1991 | [JP] | Japan | 3-277893 |
| Oct. 24, 1991 | [JP] | Japan | 3-277894 |

[51] Int. Cl.$^6$ .................................................. G06F 7/00
[52] U.S. Cl. .......................... 345/418; 345/429; 345/437; 345/433; 345/436; 345/438; 345/126
[58] Field of Search ..................... 395/500, 120, 395/118, 119, 125, 127, 133, 137, 138; 364/474; 345/418, 429, 437, 436, 126, 438, 433

[56] References Cited

U.S. PATENT DOCUMENTS

| 4,178,820 | 12/1979 | Gerber .......................................... 83/13 |
| 4,513,366 | 4/1985 | Munekata et al. ..................... 364/474.2 |
| 4,827,250 | 5/1989 | Stallkamp ............................... 340/727 |
| 4,860,220 | 8/1989 | Tanaka et al. .......................... 395/120 |
| 4,888,707 | 12/1989 | Shimada .................................... 395/90 |
| 5,056,031 | 10/1991 | Nakano et al. .......................... 364/461 |
| 5,150,026 | 9/1992 | Seraji et al. ....................... 318/568.11 |
| 5,150,305 | 9/1992 | Sekikawa ............................ 364/474.26 |
| 5,251,290 | 10/1993 | Pabon ...................................... 395/120 |
| 5,299,297 | 3/1994 | Reynolds et al. ....................... 395/121 |
| 5,303,337 | 4/1994 | Ishida ...................................... 395/119 |

FOREIGN PATENT DOCUMENTS

| 0222387A3 | 5/1987 | European Pat. Off. ........ G06F 15/72 |
| 0360599A3 | 3/1990 | European Pat. Off. ........ G06F 3/033 |
| 0407238A3 | 1/1991 | European Pat. Off. ........ G06F 15/60 |

*Primary Examiner*—Zarni Maung
*Assistant Examiner*—Saleh Najjar
*Attorney, Agent, or Firm*—Fitzpatrick Cella Harper & Scinto

[57] ABSTRACT

Disclosed are a kinematic-simulation method and a kinematic-simulation apparatus which enable simulation of the behavior of a mechanism by using a CAD figure by a simple operation. The kinematic-simulation method includes an interference operational method according to which a translation is continued until the figure associated with the operation (the driver) comes into contact with the figure associated with interference (the stop). When defining the driver translation, an interference operation is defined, whereby a translation amount (an angle or a vector) can be calculated within a computer. Accordingly, an operator does not input a rotation angle for rotation or a vector for translation.

23 Claims, 20 Drawing Sheets

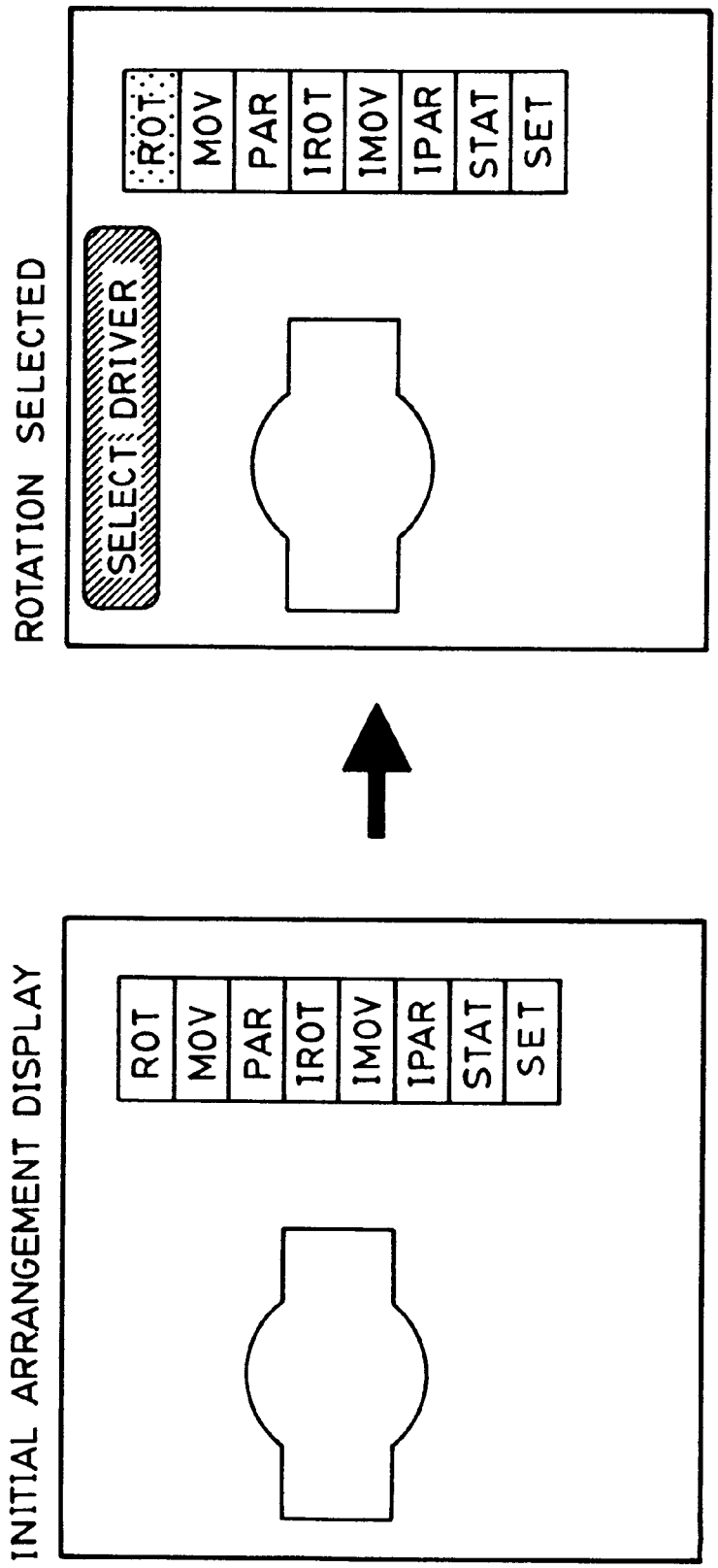

ROTATION CENTER INPUT AND DISPLAYED

DRIVER DESIGNATED AND LUMINANCE CHANGED

STOPPER DESIGNATED AND
LUMINANCE CHANGED

ROTATION DIRECTION DESIGNATED
AND TRANSLATION RESULTS DISPLAYED

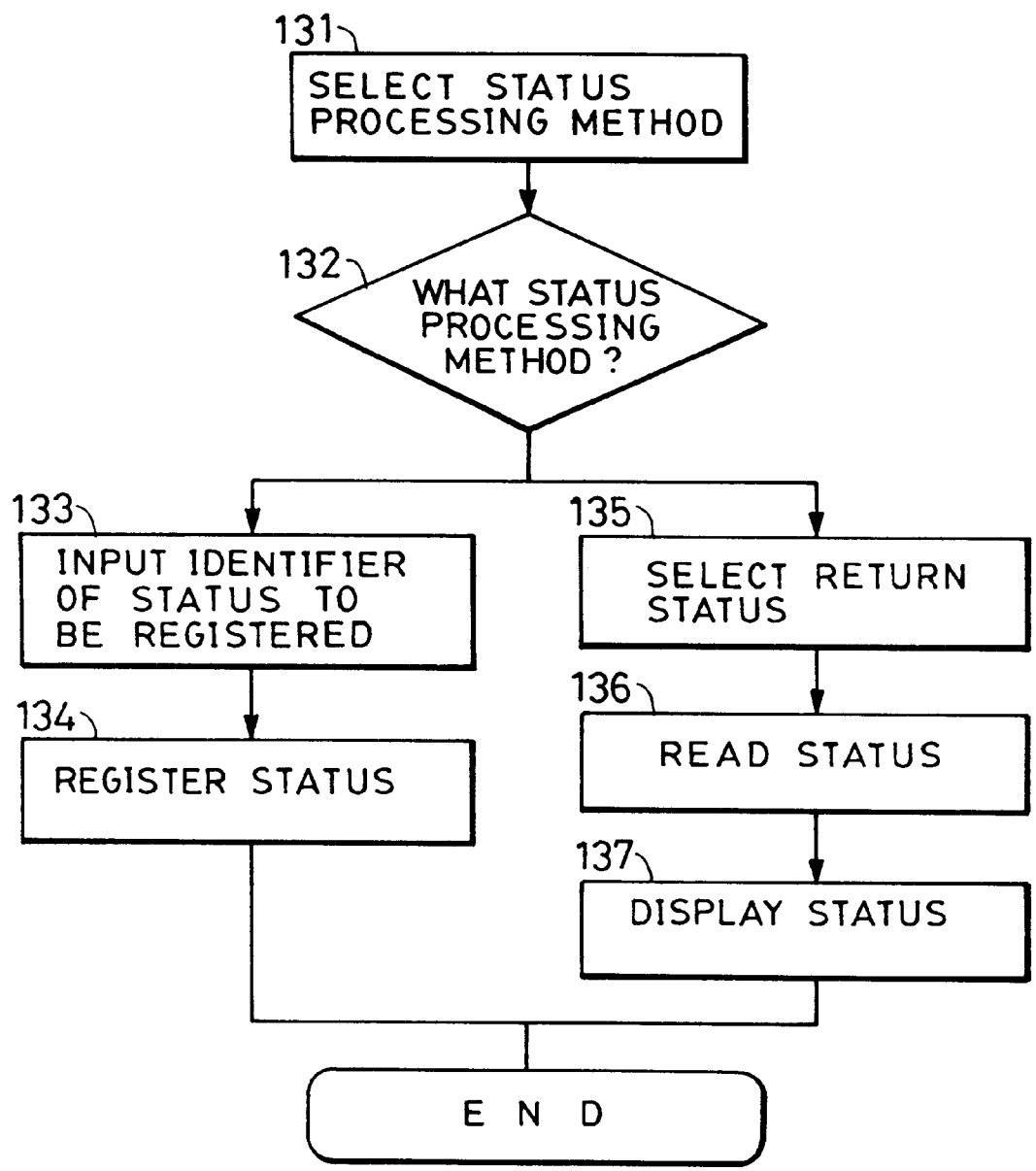

KINEMATIC-SIMULATION APPARATUS AND KINEMATIC-SIMULATION METHOD WITH INTERFERENCE PROCESSING

This application a continuation of application Ser. No. 07/965,757 filed Oct. 23, 1992, now abandoned.

BACKGROUND OF THE INVENTION

1. Field of the Invention

This invention relates to kinematic simulation and, in particular, an apparatus and a method for kinematic simulation utilizing an information processing system.

2. Description of the Related Art

A method for simulating the behavior of mechanical systems by utilizing an information processing system, such as a CAD system, is available, according to which equations of motion representing the behavior of mechanical systems are formulated by means of a computer, and the movements of the mechanism's parts are obtained by solving these equations.

When formulating equations of motion by means of an information processing system, such as a CAD system, in order to obtain the movements of the parts of a mechanism, it is necessary to prepare data on physical values, such as the moment of inertia. Thus, with this method, a kinematic simulation is not easily conducted.

In calculating the amount of interference rotation, an interference is erroneously detected when the operational figure (the figure associated with an operation) and the interference figure (the figure associated with interference) already intersect, thus making it impossible to correctly calculate the amount of interference rotation.

When, in a kinematic-simulation apparatus, such as a CAD system, the status of a mechanism at an arbitrary point in time is stored, it has been the practice to register not only positional but also diagrammatic information regarding the status. Likewise, when the mechanism is to be restored to a status at an arbitrary point in time, diagrammatic as well as positional information has been commonly read and displayed.

When the status of a mechanism at an arbitrary point in time is stored, registering diagrammatic as well as positional information regarding the status results in storage of a large amount of information. Further, when the mechanism is restored to a status at an arbitrary point in time, reading and displaying a large amount of information inclusive of diagrammatic as well as positional information substantially increases the restoring time.

In an existing system for simulating the behavior of a mechanism by utilizing an information processing system, such as a CAD system, equations of motion of the mechanism are formulated and solved by means of a computer, thereby obtaining the movements of the parts constituting the mechanism.

In calculating the amount of interference translation, an interference is erroneously detected when the operational figure and the interference figure already intersect, thus making it impossible to correctly calculate the amount of interference translation.

SUMMARY OF THE INVENTION

This invention is directed to a kinematic-simulation apparatus in which a translation type is selected and judged as a defined translation type and a translation amount is calculated. An arrangement of a figure associated with the calculated translation amount is changed and the figure arrangement is redisplayed.

According to one aspect of the invention, an interference translation mode is defined when an interference translation is selected and an interference translation amount is calculated.

According to another aspect of the invention, an interference rotation mode is defined when an interference rotation is selected and an interference rotation amount is calculated.

According to yet another aspect of the invention, an interference translation along an element, a driver, a reference element, a movement start position, a movement driver position and a stop are designated and an interference translation along the element is calculated. A display register operates the driver according to the calculation results and displays and registers the results. An interference range with respect to the driver and stop designations is then specified and an interference translation along the element is calculated with respect to the designated interference range.

BRIEF DESCRIPTION OF THE DRAWINGS

FIGS. 7(a) and 7(b) are diagrams showing an example of a rotation result display;

FIG. 13 is a status flowchart;

DESCRIPTION OF THE PREFERRED EMBODIMENTS

Figure 1:
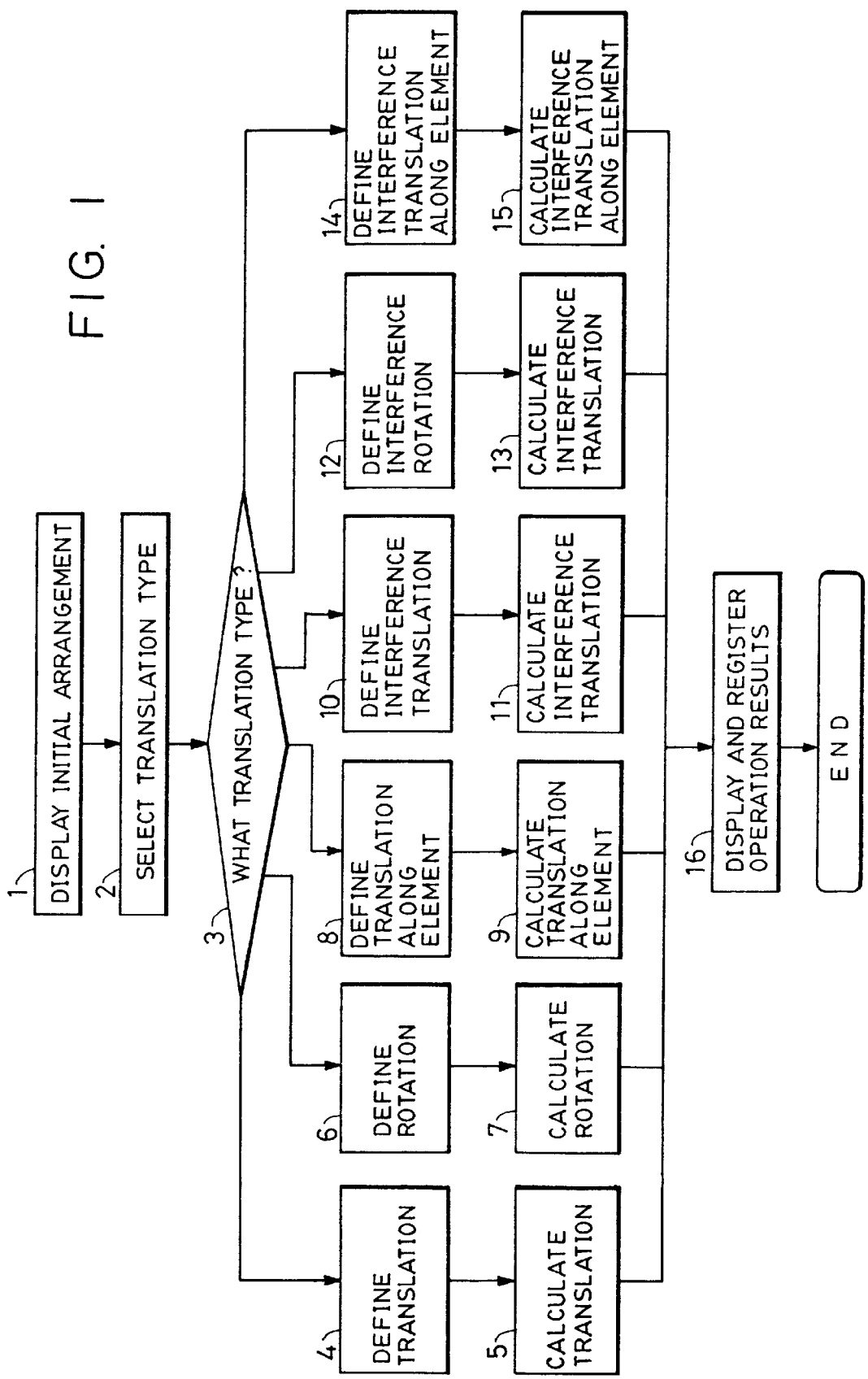
FIG. 1 is a flowchart of a kinematic simulation.

The present invention will now be described in detail with reference to the embodiments shown in the drawings.

Figure 2:
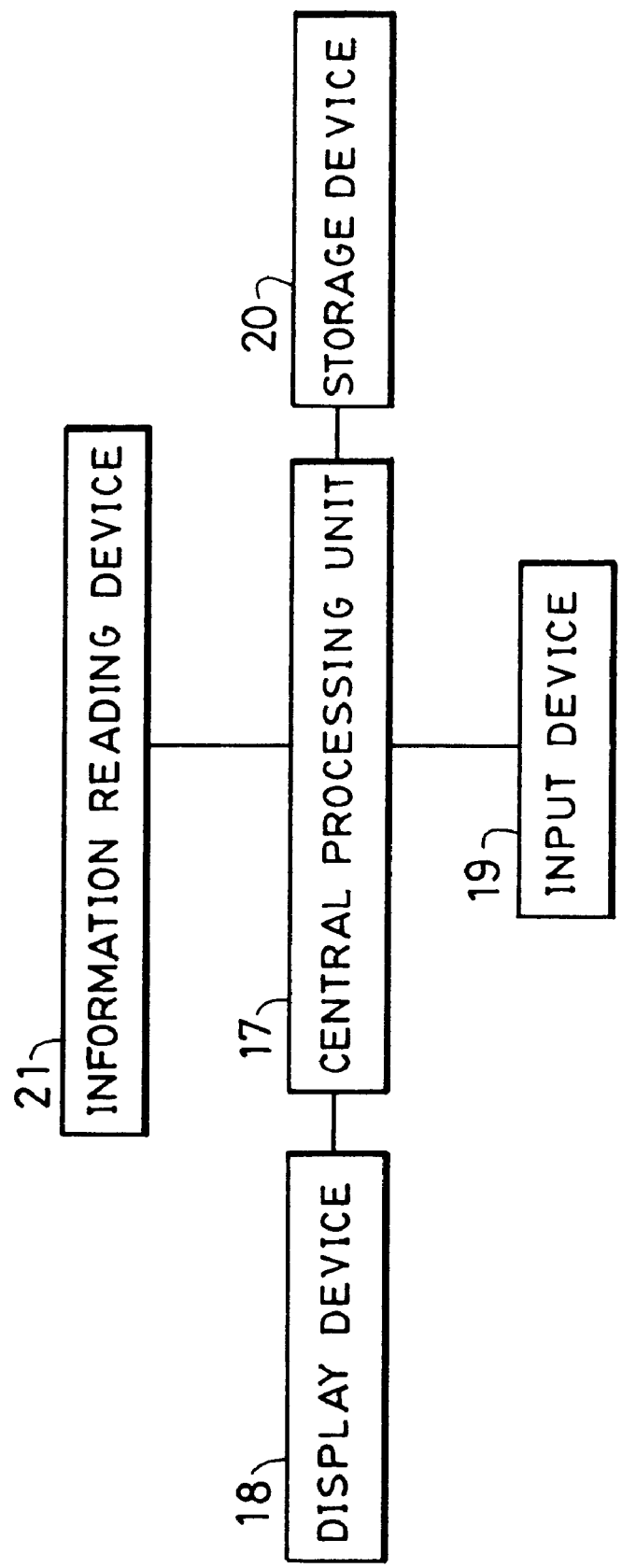
FIG. 2 is a block diagram showing an information system configuration.

FIG. 2 is a block diagram showing the construction of an information processing system to which a kinematic-simulation system according to an embodiment of the present invention is applicable. The principal section of this information processing system includes: a central processing unit 17 for executing kinematic simulations; a display device 18 which displays an element, a group of elements (hereinafter referred to as a "set") or a group of elements corresponding to a part of a mechanism (hereinafter referred to as a "part"), as an operational figure (a driver), and which further displays input information (the direction of movement, angle and movement distance), processing results, the progress of the processing, an operation-mode selection menu as shown in FIGS. 7A, 7B, etc.; an input device 19 which has a keyboard, mouse, etc. and which is used to enter the requisite operational designating information, information input, menu-selection designation or other designations; a storage device 20 for storing programs, such as procedures described below, data corresponding to CAD figure elements (sufficient geometrical information for determining a figure element which information consists, in the case of a two-dimensional line segment, of the coordinates of starting and end points; in the case of a two-dimensional circular arc, the coordinates of starting and end points and the center thereof and the direction of rotation; and, in the case of a two-dimensional circle, the coordinates of the center and the radius; and information on a group of elements and the arrangement thereof), calculated results of designated information, translation amounts, etc., data consisting of a combination of procedures needed for operations and designating information (an operation macro), flags indicating status information, etc.; and an information reading device 21 for reading programs such as operation procedures from an external memory and storing the same in the storage device 20.

In this embodiment, programs are read from an external storage medium such as a magnetic tape or a floppy disk by the information reading device 21 into the storage device 20, which may be a semiconductor RAM, a magnetic disk or the like. A CAD figure element, such as a figure associated with an operation (an operational figure), is displayed by the display device 18. Data corresponding to the displayed CAD figure element (sufficient geometrical information for determining the figure element which, in the case of a two-dimensional line segment, consists of the coordinates of starting and end points; in the case of a two-dimensional circular arc, the coordinates of starting and end points and the center as well as the direction of rotation; and, in the case of a two-dimensional circle, the coordinates of the center and the radius thereof; and information on a group of elements and the arrangement thereof) is stored in the storage device 20, and information necessary for a translation is designated through the input device 19. The translation results are re-displayed on the display device 18 and, at the same time, positional information of the operational figure, stored in the storage device 20, is changed and, further, designating information and calculations, such as the calculated operational factors, are stored in the storage device 20. It is possible to store in the storage device 20, data (translation macro) consisting of a combination of the requisite procedures and designating information for the above translation. The central processing unit 17 refers to this translation macro to continuously translate the operational figure in a designated order in accordance with the flowchart of FIG. 1, thereby simulating the operation of a mechanism or the like. Utilizing a translation macro also makes it possible to perform batch processing. In that case, the display device 18 may not be absolutely necessary, and positional data in the storage device 20 is updated.

FIG. 1 schematically shows a kinematic-simulation system configuration. The operation of the system will be described on the basis of the above-described construction. Referring to FIG. 1, numeral 2 indicates a step for selecting the translation type, in which several translation types constituting items for selection are displayed, for example, in the form of a menu, with a figure, such as an operational CAD figure, being displayed on the display device 18 (initial arrangement step 1), and selection/designation information is entered through the mouse or the keyboard of the input device 19 to select a translation type. This translation type selection is made as follows: One of the following items is selected from a menu (ROT, MOV, PAR, IROT, IMOV, IPAR) on the display screen shown in FIG. 7(a), and designated by using the mouse or the keyboard of the input device 19: a translation, a rotation, a translation along a CAD figure element (hereinafter referred to as an "element"), an interference translation, an interference rotation, and an interference translation along an element. Here, "translation" means a parallel movement of a CAD figure;
"rotation" means a rotation of a CAD figure;
"movement along an element" means a parallel movement of a CAD figure along an element;
"interference translation" means a parallel movement of a CAD figure until it hits against another CAD figure;
"interference rotation" means rotation of a CAD figure until it hits against another CAD figure; and
"interference translation along an element" means a parallel movement of a CAD figure along an element until it hits against another CAD figure.

In an operation-mode judgment step 3, the central processing unit 17 designates the processing to be executed next in accordance with the translation type designated in translation type selecting step 2. That is, when a translation (MOV) is designated, the next executed process defines the translation; when a rotation (ROT) is designated, the next executed process defines the rotation; when a translation along an element (PAR) is designated, the next executed defines the translation along the element; when an interference translation (IMOV) is designated, the next executed process defines the interference translation; when an interference rotation (IROT) is designated, the next process to be executed defines the interference rotation; and, when an interference translation along an element (IPAR) is designated, the next process to be executed defines the interference translation along the element.

In an interference translation defining step, indicated at 4, an element or an element group of more than one element (hereinafter referred to as a "set"), or an element group of more than one element corresponding to a part of a mechanism (hereinafter referred to as a "part") is designated as an operational figure (a driver) by using the input device 19, and a movement vector is designated in terms of direction of movement, angle, movement distance, etc., these items of designating information being stored in a predetermined area of the storage device 20. When the driver has been designated, the display luminance, etc. of the element or elements constituting the driver is changed, thereby checking whether the driver designation has been correctly performed.

In the translation step, indicated at 5, the central processing unit 17 performs a translation of the driver by referring to information on the driver, movement vector, etc., defined (designated) in the above step.

Figure 8B:
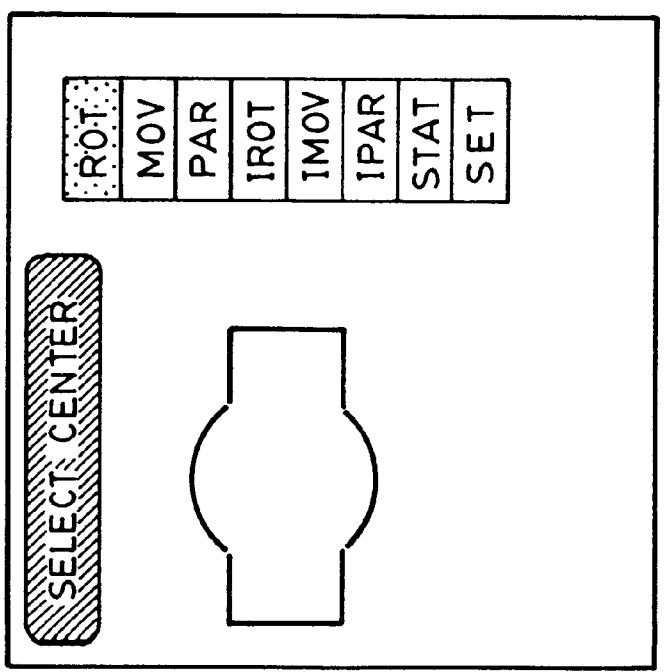
FIGS. 8(a) and 8(b) are diagrams showing an example of another rotation result display.
Figure 8A:
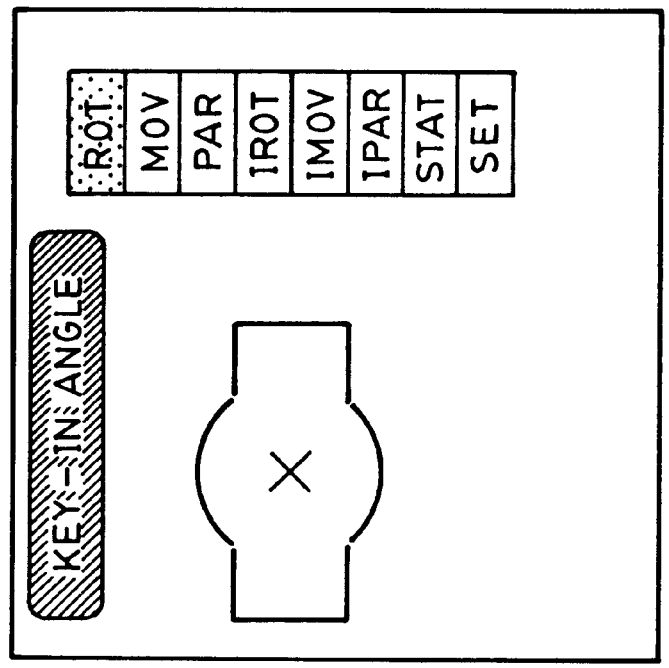
Figure 9B:
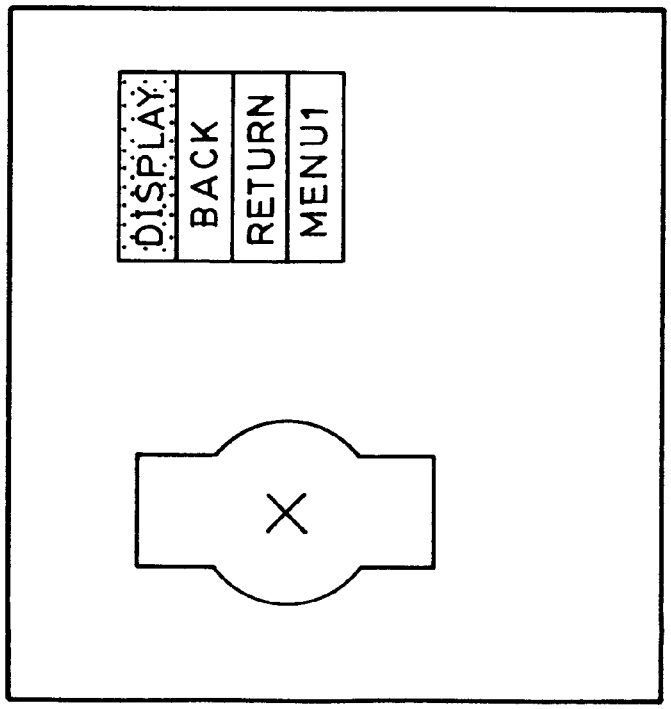
FIGS. 9(a) and 9(b) are diagrams showing an example of yet another rotation result display.
Figure 9A:
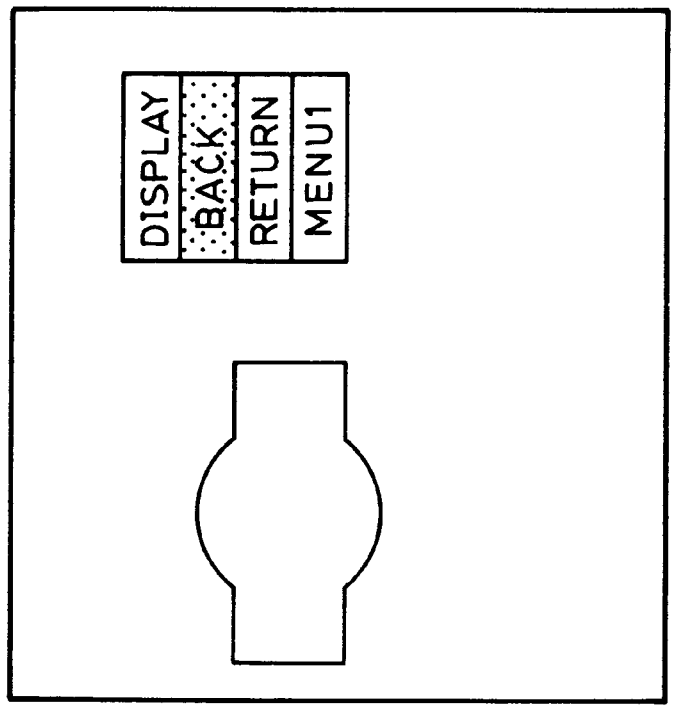

In a rotation defining step, indicated at 6, an element, a set or a part is designated as the driver in a display screen as shown in FIG. 7(*b*), FIGS. 8(*a*) and 8(*b*), and FIGS. 9(*a*) and 9(*b*), and the rotation center and the rotation angle are designated by using the input device 19, the designating information being stored in a predetermined area of the storage device 20. When the driver has been designated, the display luminance, etc. of the element constituting the driver is changed on the display device 18, thereby checking whether the driver has been correctly designated.

In a rotation calculating step 7, the central processing unit 17 performs a calculation for rotating the driver by referring to the defining information on the driver, rotation center, rotation angle, etc. on the basis of the information defined in the above step. In a translation-along-element defining step 8, an element, a set or a part is designated as the driver, and an element along which the driver moves (the reference element), a movement-start reference position on the reference element, the direction of movement, the movement distance, etc. are designated by using the input device 19, the designating information being stored in a predetermined area of the storage device 20. When the driver has been designated, the display luminance, etc. of the element constituting the driver is changed on the display device 18, thereby checking whether the driver has been correctly designated. In a translation-along-element step 9, the central processing unit 17 performs a calculation for translating the driver along the reference element by the movement distance from the movement-start reference position by referring to the information about the driver, the reference element, the movement start reference position, the direction of movement, the movement distance, etc. on the basis of the information defined in the above step.

In an interference translation defining step 10, an element, a set or a part is designated as the driver, and an element, a set or a part is designated as the interference figure (the stop element) by using the input device 19. Elements associated with interference calculation are designated as needed. The designating information is stored in a predetermined area of the storage device 20. When no element is designated as associated with interference calculation, an element which was selected by the input device 19, such as a mouse or the like, at the time when the driver and stop were selected is included as the standard, each n1 element connected before and after that being used as the interference element (the element associated with interference). The designated interference element may consist of all the elements belonging to the designated part, a designated n2 element, etc. The interference element may be designated with respect to either the driver or the stop or with respect to both of them. When the driver has been designated, the display luminance, etc. of the element constituting the driver is changed on the display device 18, thereby checking whether the driver has been correctly designated. Also with respect to the stop, the display luminance, etc. of the element constituting the stop is changed when the stop has been designated.

In an interference translation step 11, the central processing unit 17 performs interference calculation for obtaining the amount of movement of the driver until it starts to interfere with the stop by referring to the information regarding the driver and stop, the direction of movement, and the interference-calculation element (as needed), designated in the above step and stored in the storage device 20.

Figure 16:
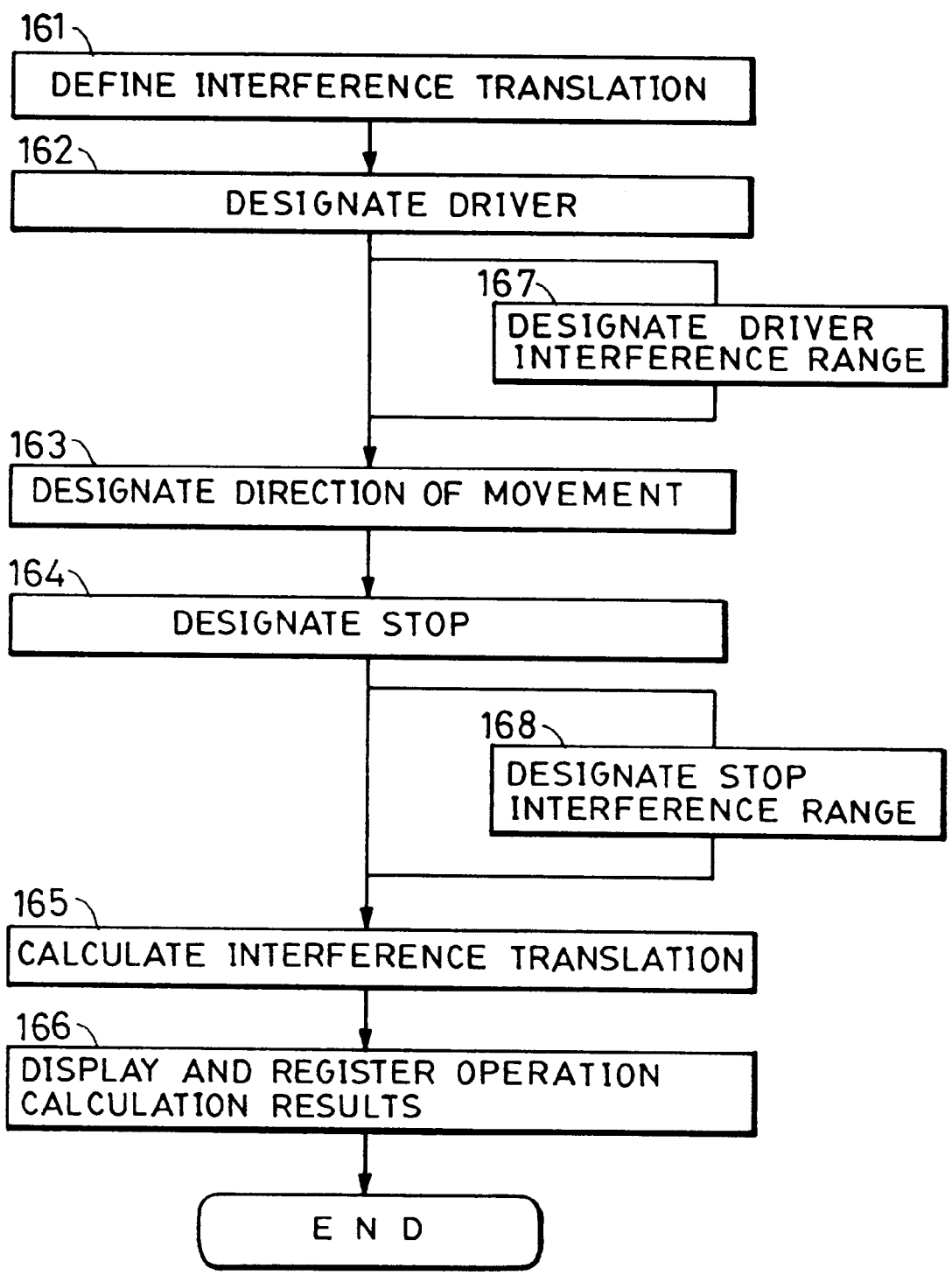
FIG. 16 is a flowchart of an interference translation.

FIG. 16 is a flowchart illustrating in detail the interference translation defining step 10, the interference translation calculating step 11 and the operation result display/register step 16, to which the procedure advances from the translation type selecting of steps 2 and 3 of FIG. 1.

In an interference translation designating step 161, an interference translation is designated by using the input device 19 consisting of a mouse or a keyboard. In a driver designating step 162, an element, a set or a part is designated as the driver by using the input device 19 consisting of a mouse or the like. Further, if there is an interference range to be designated, the designation thereof is effected in step 167 in the same manner as described above. In a driver movement direction designating step 163, the driver movement direction is designated in terms of a vector or an angle with respect to a reference axis by using the input device 19 consisting of a keyboard or the like. In a stop designating step 164, an element, a set or a part is designated as the stop. The above designated information is stored in a predetermined area of the storage device 20. Further, if there is an interference range to be designated, the designation thereof is effected in step 168 in the same manner as described above. In an interference translation calculating step 165, the central processing unit 17 performs interference calculation for obtaining the amount of movement of the driver up to the time when the driver interferes with the stop by referring to the designated information regarding the driver and stop, the direction of movement and, as needed, the interference-calculation element, stored in the storage device. In a step 166, the driver is translated in accordance with calculated results obtained in interference translation calculating step 165 and is displayed. The driver is re-displayed on the display device 18 and, at the same time, information on any change in its arrangement is reflected in the positional information in the storage device 20 consisting of a memory, a magnetic disk or the like, and is stored therein.

Driver designating step 162, driver movement direction designating step 163 and stop designating step 164 may be executed in any order. In the interference rotation defining step 12, an element, a set or a part as the driver, an element, a set or a part as the stop, the center of rotation, and the direction of rotation are designated by using the input device 19, interference-calculation elements being designated as needed. When no interference-calculation element is designated, an element selected by the input device 19 such as a mouse or the like when the driver and stop were designated is included as the standard, and each n1 element connected before and after that is used as an interference element. The interference element selected may consist of all the elements belonging to the designated part, a designated n2 element, etc. The interference-calculation element may be selected with respect to either the driver or the stop or with respect to both of them. By changing the display luminance, etc. of the element constituting the driver at the time it is designated, it is possible to check whether the driver has been correctly designated. Also with respect to the stop, the display luminance or the like of the element constituting the stop is changed when it is designated.

In the interference rotation step 13, the central processing unit 17 performs interference calculation for obtaining the rotation amount up to the time when the driver starts to interfere with the stop by referring to the designated driver and stop, the direction of movement and, as needed, the interference-calculation element.

Figure 17:
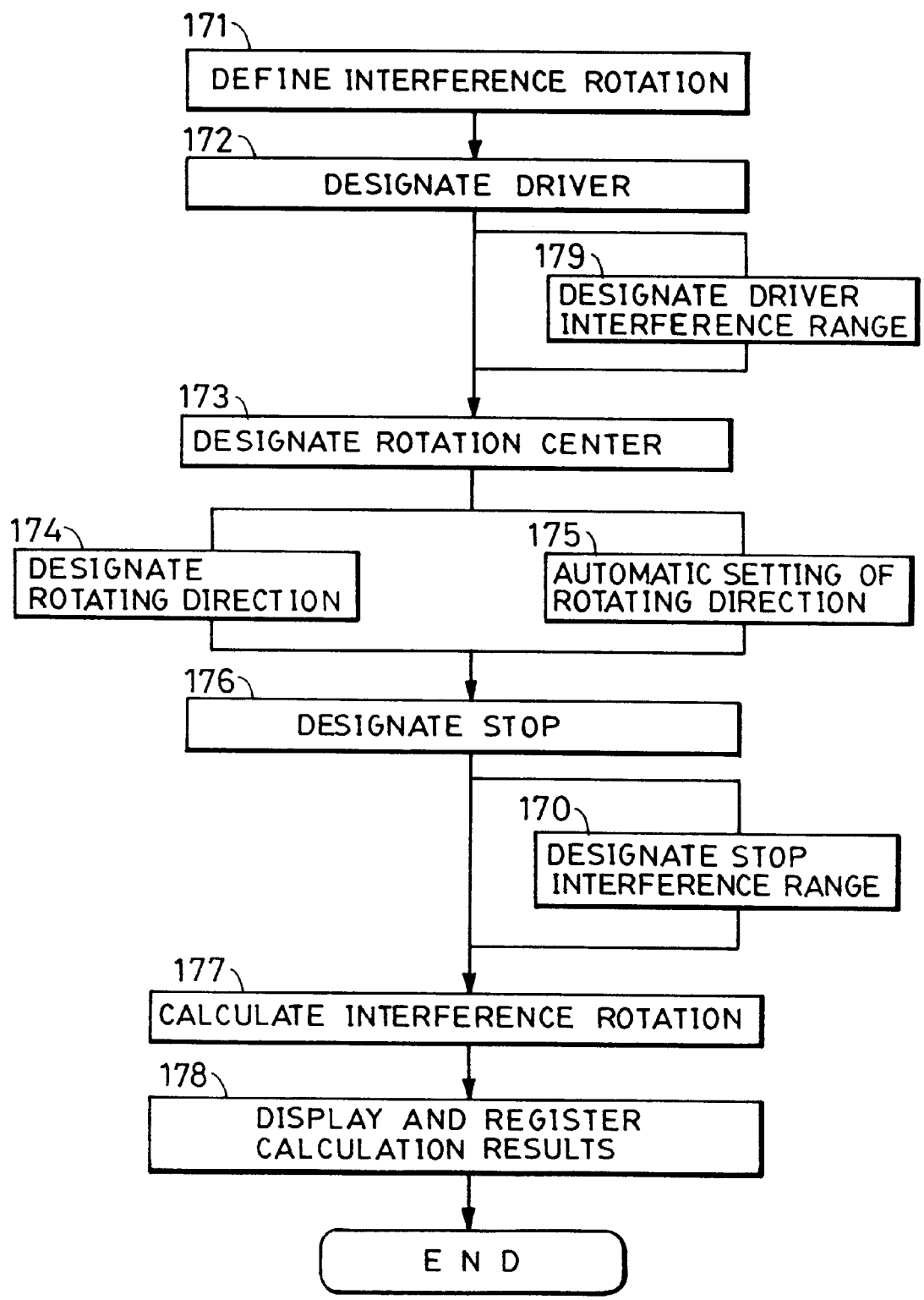
FIG. 17 is a flowchart of an interference rotation.

Next, FIG. 17 is a flowchart illustrating in detail the interference rotation defining step 12, the interference rotation calculating step 13 and the translation result display/register step 16, to which the procedure advances from the translation type selecting steps 2 and 3. The processes will be described in detail with reference to this flowchart.

In an interference rotation designating step 171, an interference rotation is designated by using the input device 19, a mouse or the like. In a driver designating step 172, an element, a set or a part is designated as the driver by using the input device consisting of a keyboard, a mouse or the like. The designated information is stored in a predetermined area of the storage device 20. Further, if there is an interference range to be designated, the designation thereof is effected in step 179 in the same manner as described above. In a driver rotation center designating step 173, the coordinates of the driver rotation center are designated by using the input device consisting of a keyboard or the like. In direction of rotation designating step 174, the direction of rotation of the driver is designated by using the input device 19, e.g., a mouse or the like. In a direction of automatic rotation setting setting step 175, a flag for automatically setting a rotating direction is set by using the input device 19 consisting of a keyboard or the like. In a stop designating step 176, an element, a set or a part is designated as the stop by using the input device 19, e.g., a mouse or the like. The designated information is stored in a predetermined area of the storage device 20. Further, if there is an interference range to be designated, the designation thereof is effected in step 170 in the same manner as described above. When this definition has been completed, a calculation process is conducted. In a interference rotation calculating step 177, the central processing unit 17 performs an interference calculation to obtain the rotation angle it takes for the driver to start to interfere with the stop by referring to the designated driver and stop, the rotation center, the direction of rotation or the flag for automatically setting the direction of rotation, and the interference rotation calculation element (as needed). In step 178, the driver is translated in accordance with the calculated results obtained in the interference rotation calculating step and is displayed. The driver is re-displayed on the display device 18 and, at the same time, information on any change in its arrangement is reflected in the positional information existing in the storage device 20 consisting of a memory, a magnetic disk or the like and is stored therein.

The driver designating step 172, the driver rotation center designating step 173, the rotation direction designating step 174 or the direction of automatic rotation setting step 175, and the stop designating step 176 may be executed with their order changed.

In the interference-translation-along-element defining step 14, an element, a set or a part is designated as the driver, and an element, a set or a part is designated as the stop. Further, a reference element, a movement start reference position on the reference element, a direction of movement, etc. are designated. The designation is conducted by using the input device 19. The designated information is stored in a predetermined area of the storage device 20. When no interference-calculation element is designated, an element selected by the input device 19 consisting of a mouse or the like when the driver and stop were designated is included as the standard, each n1 element connected before and after that being stored in the storage device 20 as the interference element (the element associated with interference). The designated interference element may consist of all the elements belonging to the designated part. In the case of an element associated with interference calculation which can be designated in the form of a designated n2 element or the like, it can be designated with respect to either the driver or the stop or to both of them. By changing the display luminance, etc. of the element constituting the driver in the display device 18 when the driver is designated, it is possible to check whether the driver has been correctly designated. Also with respect to the stop, the display luminance, etc. of the element constituting the stop is changed when it is designated.

In interference-translation-along-element calculating step 15, the central processing unit 17 performs interference calculation to obtain the amount of movement it takes for the driver to interfere with the stop by referring to the defined information in the storage device: the designated driver, the reference element, the movement start reference position, the direction of movement, the stop, the element associated with interference calculation, etc.

Figure 18:
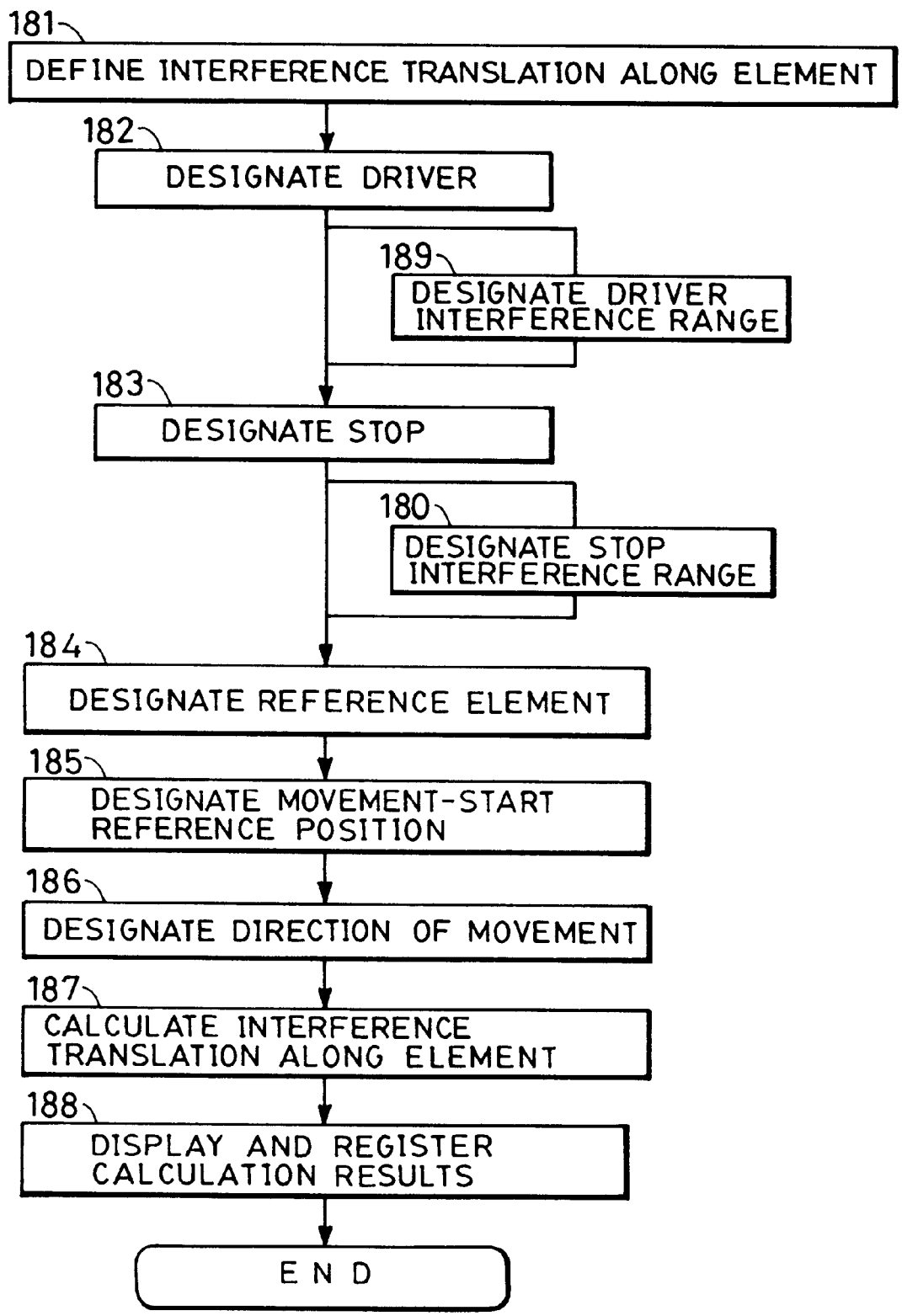
FIG. 18 is a flowchart of a translation along an interference element.

Next, FIG. 18 is a flowchart illustrating in detail the translation type selecting steps 2 and 3, the interference-translation-along-element defining step 14, the interference-translation-along-element calculating step 15, and the translation result display/register step 16. These steps will be described in detail with reference to this flowchart.

In interference-translation-along-element designating step 181, an interference translation is designated by using the input device 19 consisting of a mouse or the like. In driver designating step 182, an element, a set or a part is designated as the driver by using the input device 19 consisting of a mouse or the like. Further, if there is an interference range to be designated, the designation thereof is effected in step 189 in the same manner as described above. In a reference element designating step 183, an element is designated by using the input device 19 (e.g., a mouse or the like). Further, if there is an interference range to be designated, the designation thereof is effected in step 180 in the same manner as described above. In a movement-start-reference-position designating step 184, a movement start reference position on the reference element is designated by using the input device 19 consisting of a mouse or the like. In a driver movement direction designating step 185, a direction of movement of the driver is designated by using the input device 19 consisting of a mouse or the like. In a stop designating step 186, an element, a set or a part is designated as the stop by using the input device 19 (e.g., a mouse or the like). The designated information is stored in a predetermined area of the storage device 20. Then, defined information is calculated in the a step 187. In the interference-translation-along-element calculating step 187, the central processing unit 17 performs interference calculation for obtaining the amount of movement up to the time when the driver, moving along the reference element, starts to interfere with the stop, by referring to the driver and designated stop, the reference element and the movement start reference position thereon, the direction of movement and, as needed, the element associated interference calculation. In step 188, the driver is operated in accordance with the calculated results obtained in the interference-translation-along-element calculating step and is displayed. The driver is re-displayed on the display device 18 and, at the same time, information on any change in its arrangement is reflected in the positional information existing in the storage device 20 consisting of a memory, a magnetic disk or the like and is stored therein. The driver designating step 182, the reference element designating step 183, the step 184 in which the movement start reference position on the reference element is designated, the driver movement direction designating step 185, and the stop designating step 186 may be executed with their order changed.

In the display/register step 16, the driver is moved by the translation amount calculated in the above step. The driver is re-displayed on the display device 18 and, at the same time, information on any change in its arrangement is reflected in the positional information existing in the storage device 20, such as a memory, a magnetic disc or the like, and is stored therein. The condition immediately before the translation is stored in the storage device 20 and, by supplying a return command through the input device 19, the driver can be restored to the status before the operation. By utilizing this function, the driver can be restored by a simple operation if it has been translated under the wrong definition.

Figure 3A:
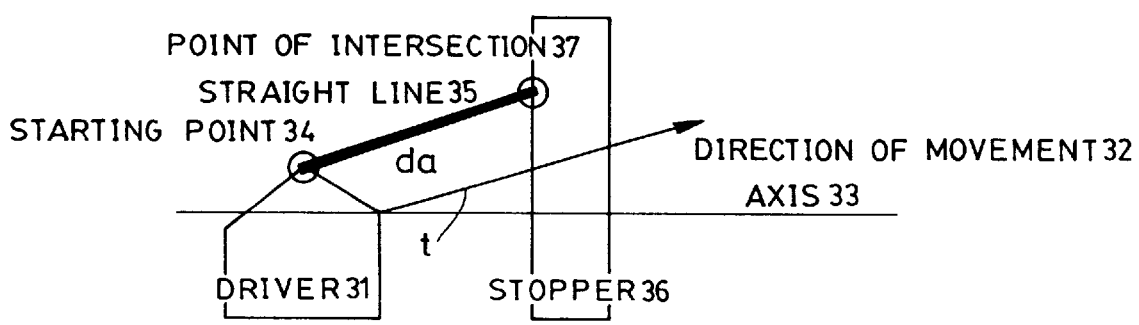
FIGS. 3(a) and 3(b) are diagrams illustrating an interference translation calculation.
Figure 3B:
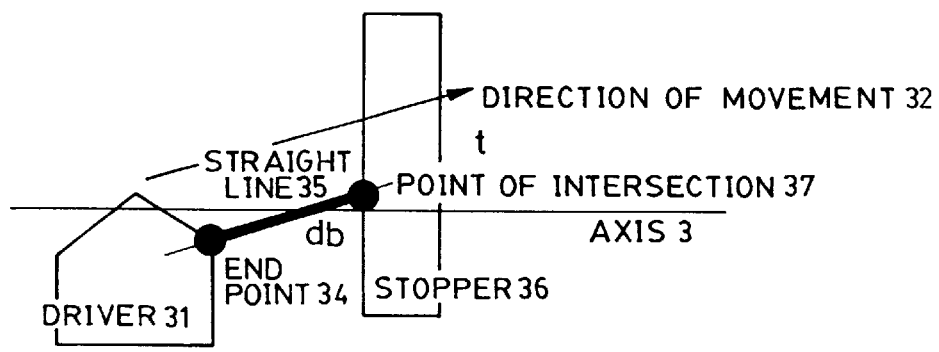
Figure 4A:
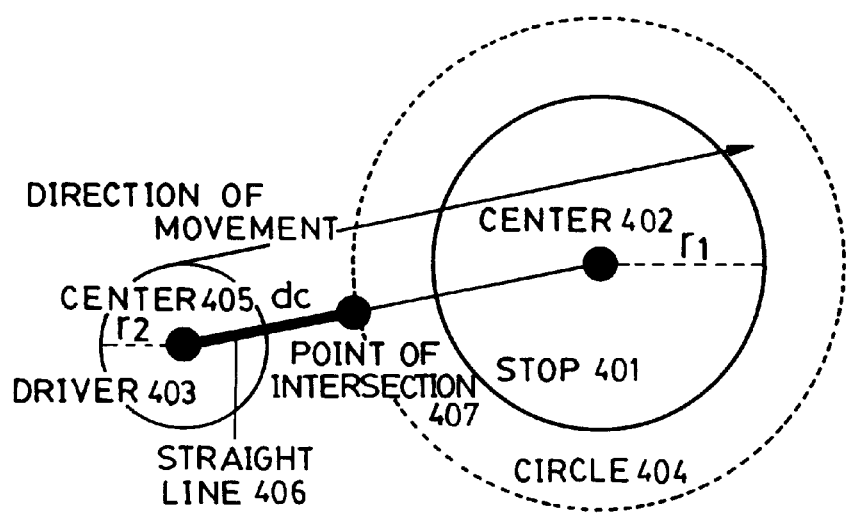
FIGS. 4(a), 4(b) and 4(c) are diagrams illustrating an interference translation calculation.
Figure 4B:
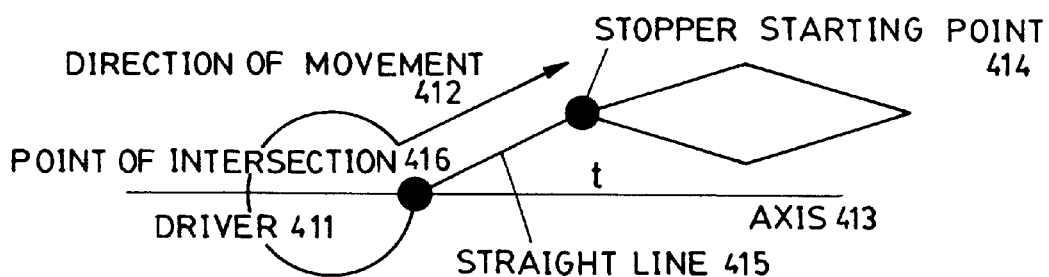
Figure 4C:
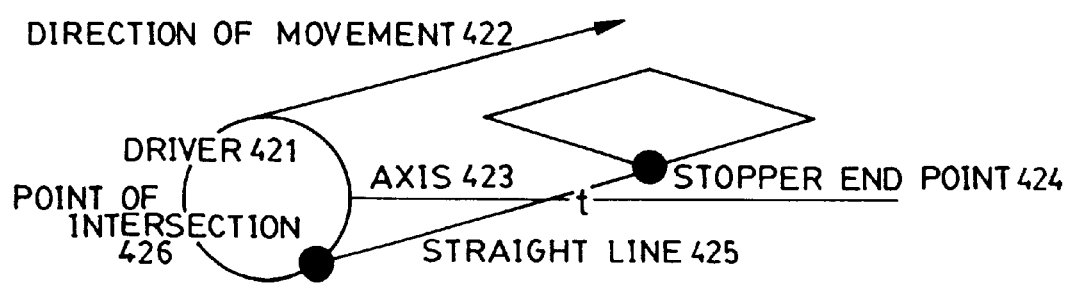
Figure 5A:
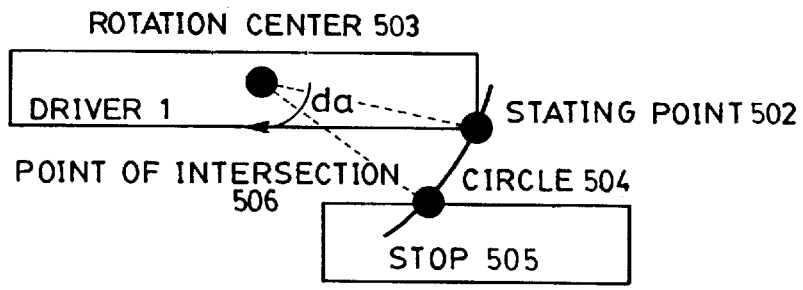
FIGS. 5(a), 5(b) and 5(c) are diagrams illustrating an interference rotation calculation.
Figure 5B:
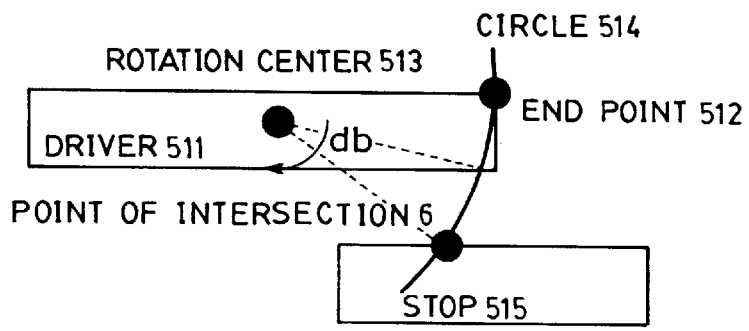
Figure 5C:
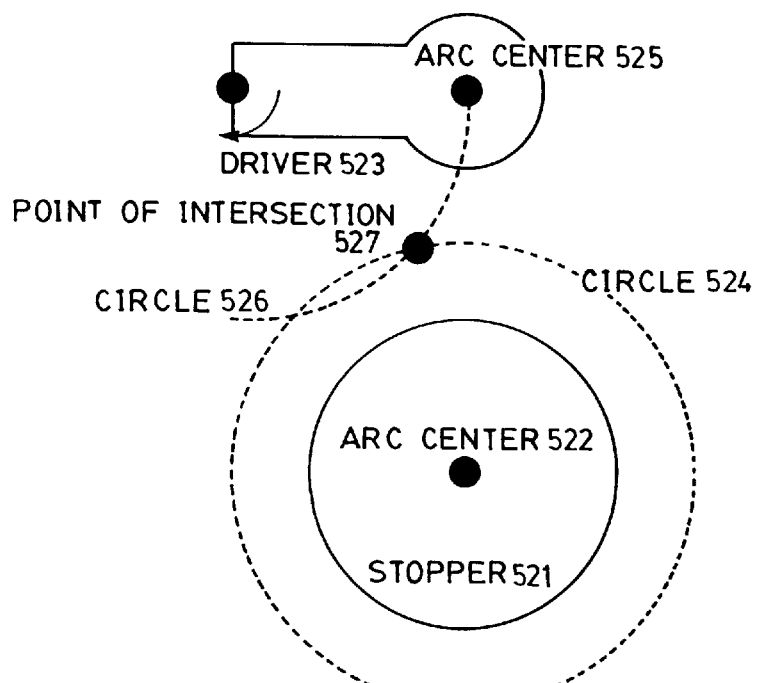
Figure 6A:
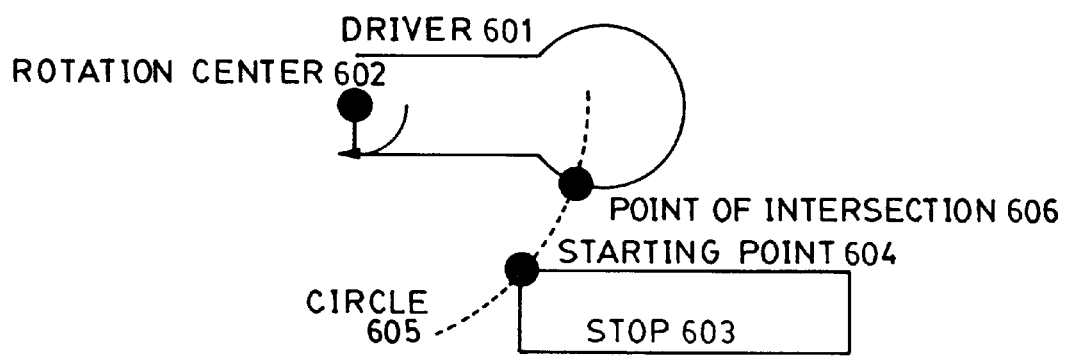
FIGS. 6(a) and 6(b) are diagrams illustrating another interference rotation calculation.
Figure 6B:
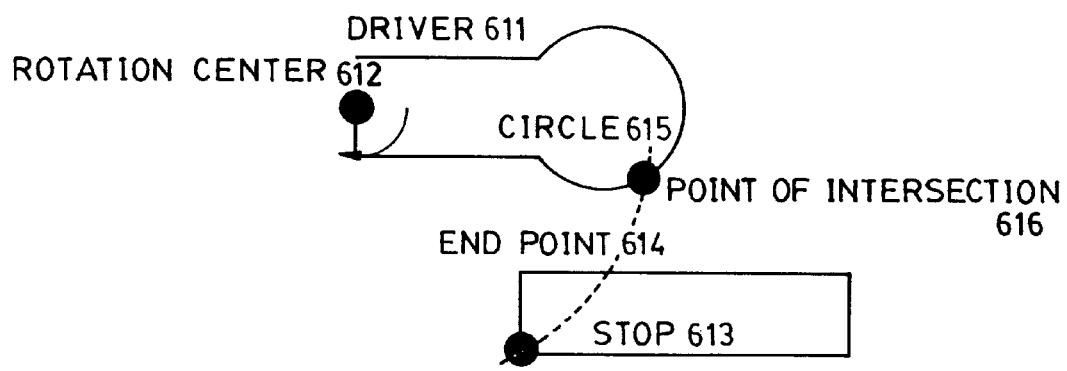
Figure 10B:
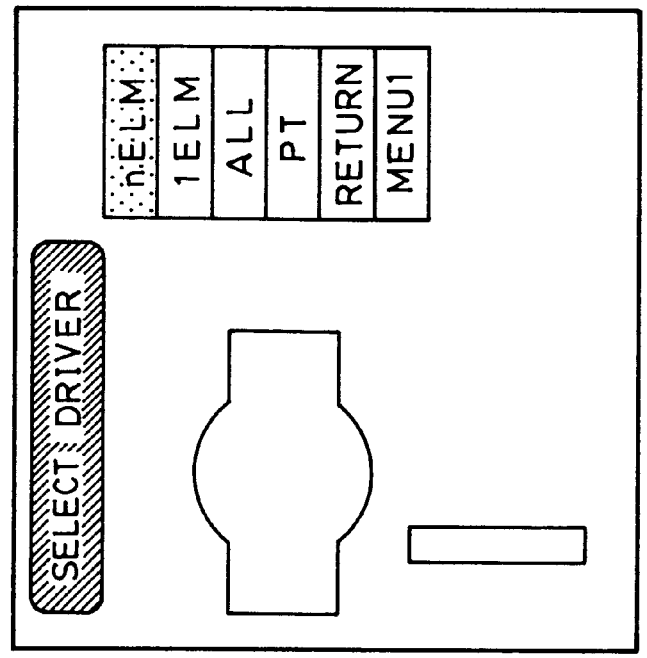
FIGS. 10(a) and 10(b) are diagrams showing an example of an interference rotation result display.
Figure 10A:
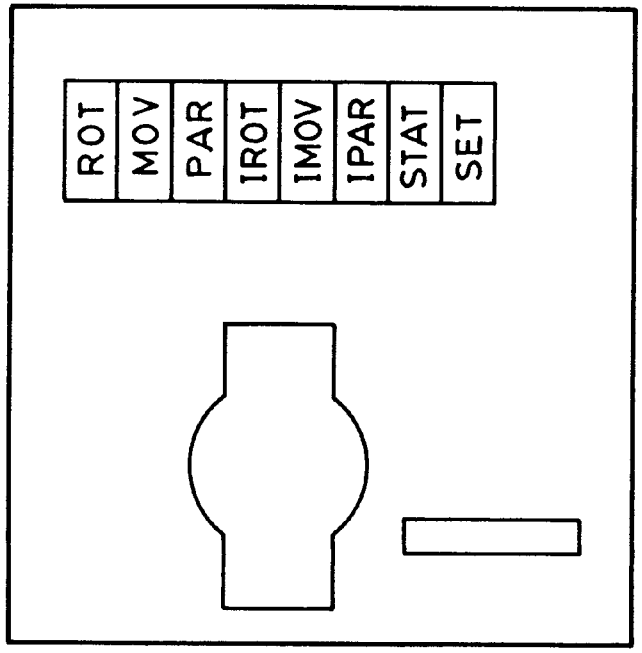
Figure 11B:
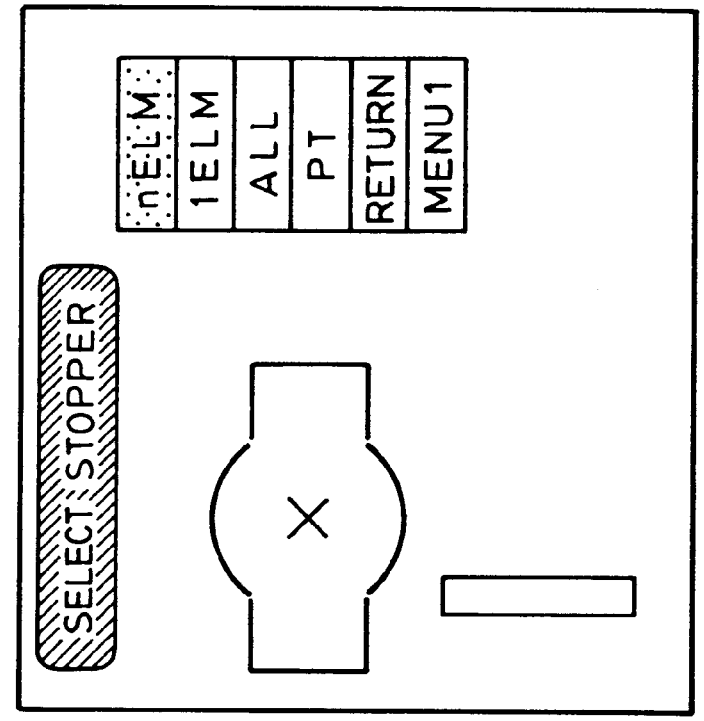
FIGS. 11(a) and 11(b) are diagrams showing an example of another interference rotation result display.
Figure 11A:
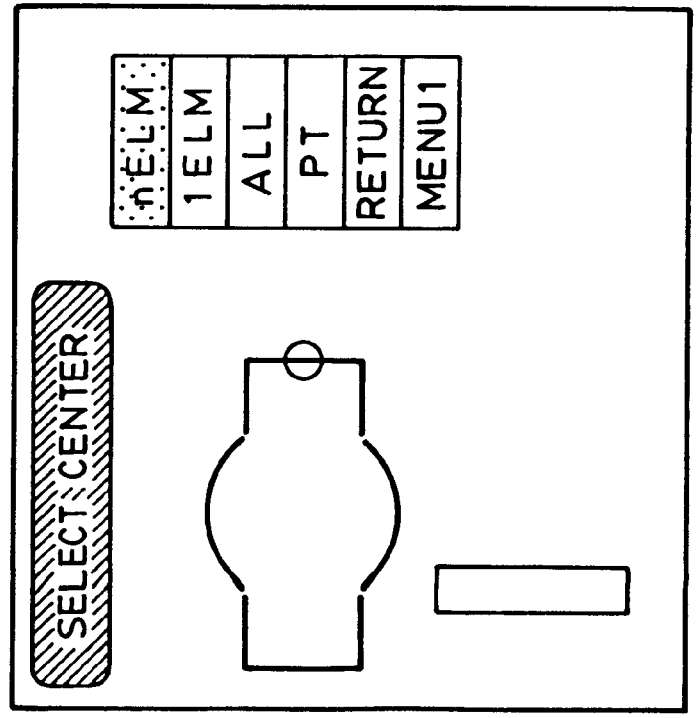
Figure 12A:
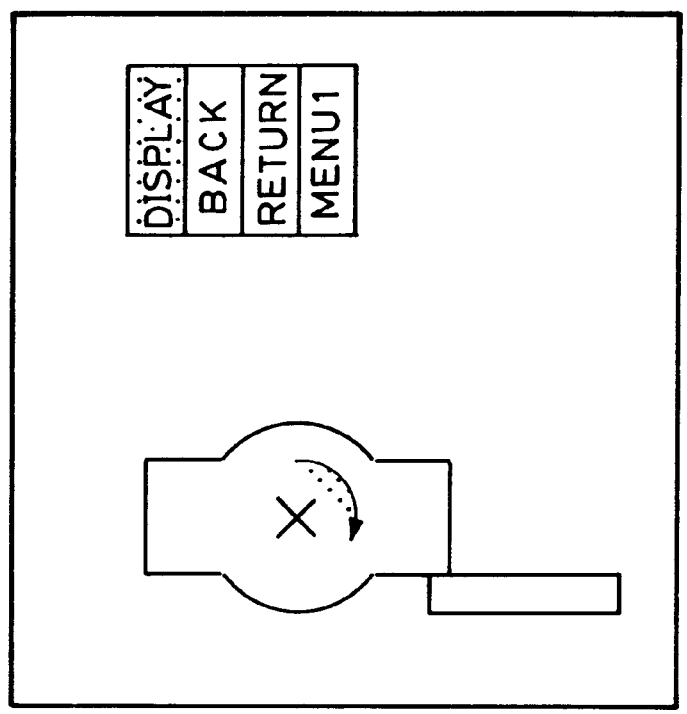
FIGS. 12(a) and 12(b) are diagrams showing an example of yet another interference rotation result display.
Figure 12B:
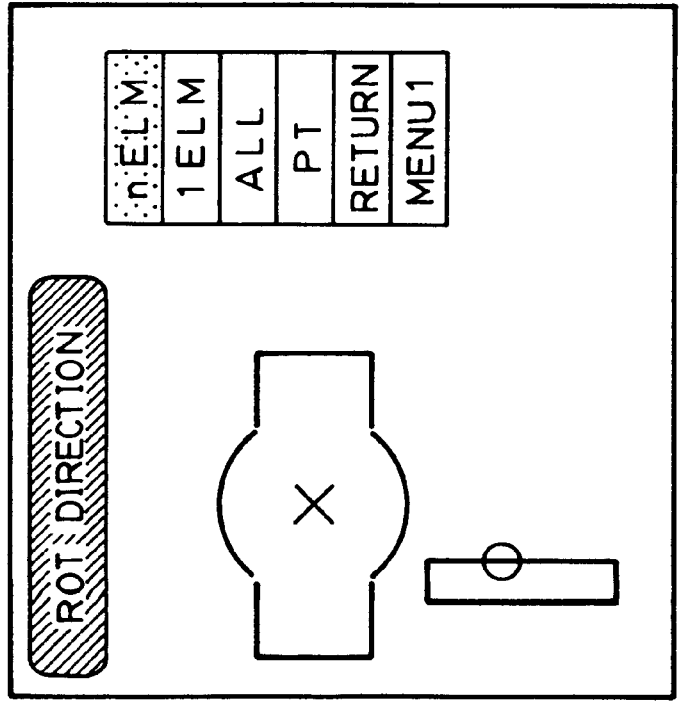

Next, the interference calculation in the kinematic-simulation system, constructed as described above, will be further explained with reference to FIGS. 3(*a*) and 3(*b*), FIGS. 4(*a*), 4(*b*) and 4(*c*), FIGS. 5(*a*), 5(*b*) and 5(*c*), FIGS. 6(*a*) and 6(*b*), FIGS. 7(*a*) and 7(*b*), FIGS. 8(*a*) and 8(*b*), FIGS. 9(*a*) and 9(*b*), FIGS. 10(*a*) and 10(*b*), FIGS. 11(*a*) and 11(*b*) and FIGS. 12(*a*) and 12(*b*).

In view of the significance of the speed at which the interference calculation is performed in the interference translation step 11 and the interference rotation step 13 of FIG. 1, the element to be translated can be designated in the manner described above. The interference calculation is conducted between the interference element on the driver side and the interference element on the stop side.

First, the method of interference calculation in the interference translation step 11 will be described. When an element constituting the driver interferes with an element constituting the stop, the minimum of the following distances (a) through (e) is the distance of interference between them:

(a) A distance da when a starting point of an element on the driver side moves to interfere with an element on the stop side (except for the starting and end points thereof). For example, when, as shown in FIG. 3(*a*), a direction of movement 32 of a driver 31 is at an angle t with respect to an axis 33, is the point of intersection 37 of the stop 36 and a straight line 35 inclined at the angle t and intersecting the starting point 34 of the driver 31 is obtained. da is the distance between the starting point 34 of the driver 31 and the point of intersection 37 of the straight line 35 and the stop 36. When there are a plurality of points of intersection, the one closest to the starting point 4 is regarded as the point of intersection 37.

(b) A distance db when the end point of the element on the driver side moves to interfere with the element on the stop side (except for the starting and end points thereof). For example, when, as shown in FIG. 3(*b*), the direction of movement 32 of the driver 31 is inclined at an angle t with respect to the axis 33, the point of intersection 37 of the stop 36 and a straight line 35 intersecting the end point 34 of the driver 31 is obtained. db is the distance between the end point 34 of the driver 31 and the point of intersection 37 of the straight line 35 and the stop 36. When there are a plurality of points of intersection, the one closest to the end point 34 is the point of intersection 37.

(c) A distance dc when a point on an element on the driver side (except for the starting and end points thereof) moves to interfere with an element on the stop side (except for the starting and end points thereof). Suppose, for example, the elements on the driver and stop sides are both circular arcs or circles, as shown in FIG. 4(*a*). Assuming that the radius of the circular arc of the stop 401 is r1, and the radius of the circular arc of the driver 403 is r2, the point of intersection 407 of a circle 404 whose radius is the sum of these radii, r1+r2, and a straight line 406 which is a locus of the center 405 of the circular arc of the driver 403 is obtained. Here, dc is the distance between the center 405 of the circular arc of the driver 403 and the point of intersection 407. When there are a plurality of points of intersection, the one closest to the center 405 is the point of intersection 407.

(d) A distance dd when a point on an element on the driver side (except for the starting and end points thereof) moves to interfere with the starting point on an element on the stop side. For example, when, as shown in FIG. 4(*b*), the direction of movement 412 of the driver 411 is inclined at an angle of t with respect to an axis 413, the point of intersection 416 of the driver 411 and a straight line 415 intersecting the starting point 414 of the stop and inclined at the angle t is obtained. Here, dd is the distance between the starting point 414 of the stop and the point of intersection 416. When there are a plurality of points of intersection, the one closest to the starting point 414 is the point of intersection 416.

(e) A distance de when an point on an element on the driver side (except for the starting and end points thereof) moves to interfere with an element on the stop side. For example, when, as shown in FIG. 4(*c*), the direction of movement 422 of the driver 421 is at an angle of t with respect to an axis 423, the point of intersection 426 of the driver 421 and a straight line 425 intersecting the end point 424 of the stop and inclined at the angle t is obtained. Here, de is the distance between the end point 424 of the stop and the point of intersection 426. When there are a plurality of points of intersection, the one closest to the end point 424 is the point of intersection 426.

The distance of interference with respect to all the combinations of the interference elements on the driver and stop sides are calculated for all the cases (a)~(c). However, the above cases (a)~(c) include a case where the distance of interference cannot be obtained. Of all the distances of interference obtained, the minimum one is the amount of movement in the interference translation.

Next, the interference calculation method in the interference rotation step 13 will be described. The angle of interference when an element constituting the driver and an element constituting the stop interfere with each other is the minimum of the following angles (a) through (e):

(a) An angle da when the starting point of the driver element rotates to interfere with stop element (except for the starting and end points thereof). For example, as shown in FIG. 5(*a*), a circle 4 will be considered which is the locus of movement of the starting point 502 of the driver 501 around the center of rotation 503. The point of intersection 506 of the circle 504 and the stop 505 is obtained. The angle as measured in the designated direction of rotation from the starting point 502 of the driver 501 to the point of intersection 506 is the angle da. When there are a plurality of points of intersection, the one which is the minimum as measured from the starting point 502 in the direction of rotation is the point of intersection 506.

(b) An angle db when the driver element rotates to interfere with the stop element (except for the starting and end points thereof). For example, as shown in FIG. 5(*b*), a circle is considered which is the locus of movement of the end point 512 of the driver 511 around the center of rotation 513. The point of intersection 516 of the circle 514 and the stop 515 is obtained. db is the angle as measured in the designated direction from the end point 512 of the driver 511 to the point of intersection 516. When there are a plurality of points of intersection, the one which is the minimum as measured from the end point 512 in the direction of rotation is the point of intersection 516.

(c) An angle dc when a point on the driver element (except for the starting and end points thereof) rotates to interfere with the stop element (except for the starting and end points thereof). For example, a case will be considered where, as shown in FIG. 5(*c*), the elements on the driver and stop sides are both circular arcs or circles. The radius of the circular arc of the stop 521 is r1 and the radius of the circular arc of the driver 523 is r2. Here, the point of intersection 527 of a circle 524 whose center is the center 522 of the arc of the stop 521 and whose radius is r1+r2 and a circle 526 which is the locus of movement of the center 525 of the driver 523 around the center of rotation is obtained. The above dc is the angle as measured in the designated direction of rotation from the center 525 of the arc of the driver 523 to the point of intersection 527. When there are a plurality of points of intersection, the one which is the minimum as measured from the center 525 in the direction of rotation is the point of intersection 527.

(d) An angle dd when a point on the driver element (except for the starting and end points thereof) rotates to interfere with the starting point of the stop element. For example, as shown in FIG. 6(*a*), the point of intersection 606 of the driver 601 and a circle 605 whose center is the center of rotation 602 of the driver 601 and whose circumference passes the starting point 604 of the stop 603 is obtained. dd is the angle as measured in the designated direction of rotation from the point of intersection 606 to the starting point 604 of the stop 603. When there are a plurality of points of intersection, the minimum one as measured from the starting point 604 in a direction reverse to the direction of rotation is the point of intersection 606.

(e) An angle de when an point on the driver element (except for the starting and end points thereof) rotates to interfere with the end point on the stop element. For example, as shown in FIG. 6(*b*), the point of intersection 616 of the driver 611 and a circle 615 whose center is the center of rotation 612 of the driver 611 and whose circumference passes the end point 614 of the stop 613 is obtained. The angle de is the angle as measured from the point of intersection 616 to the end point 614 of the stop in the designated direction of rotation. When there are a plurality of points of intersection, the one which is the minimum as measured from the end point in a direction reverse to the direction of rotation is the point of intersection 616.

The interference angle calculation is performed for all the combinations of the interference elements on the driver and stop sides with respect to all the above cases (a) through (e). However, the above (a) through (e) include a case where it is impossible to obtain an interference angle. Of all the angles of interference obtained, the minimum one is the rotation angle in the interference rotation.

Next, the interference calculation method in the interference-translation-along-element step 15 will be described. When the reference element is a line segment, the distance the driver moves until it starts to interfere with the stop is obtained by the above-described interference translation calculation method. When the distance is larger than the line segment, it is judged that no interference has occurred, and when the distance is smaller than the line segment, it is judged that interference has occurred. When the reference element is a circular arc, the minimum of the following distances (a) through (e) is compared with the length of the circular arc. When the distance is larger than the length of the circular arc, it is judged that no interference has occurred, and when the distance is smaller than the length of the circular arc, it is judged that interference has occurred. The calculation is repeated for each reference element until the driver interferes with the stop.

Figure 19A:
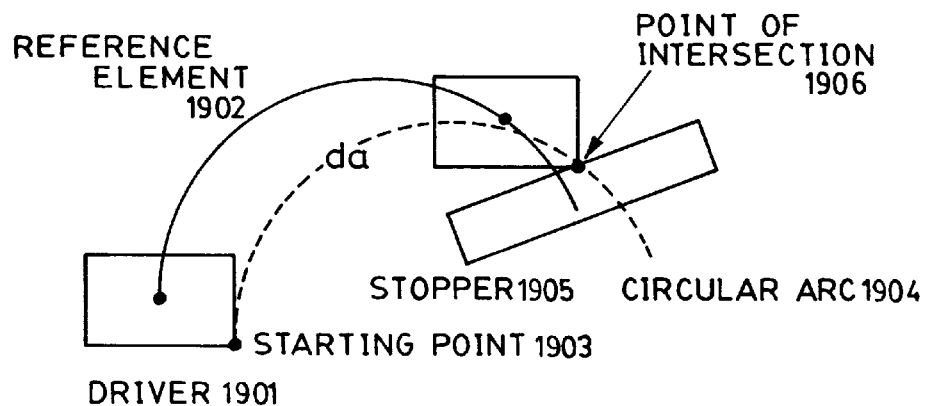
FIGS. 19(a), 19(b) and 19(c) are diagrams illustrating the calculation of a translation along an interference element.
Figure 19B:
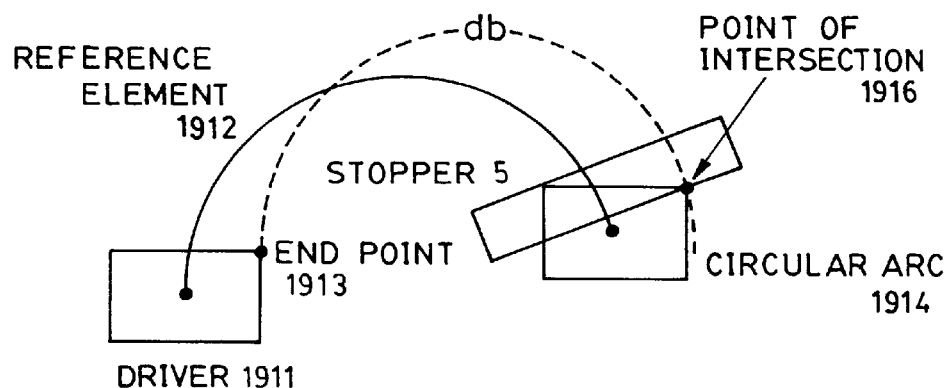
Figure 19C:
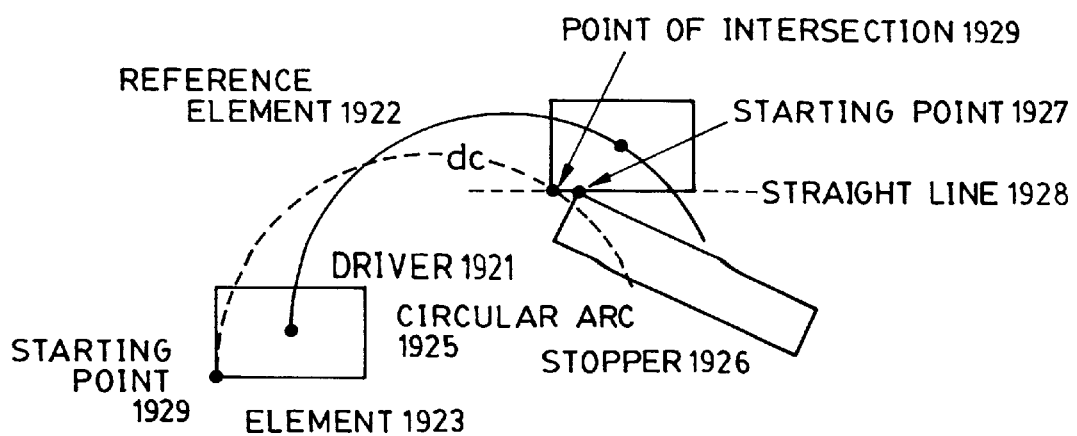

(a) A distance da when the starting point of the driver element moves to interfere with the stop element (except for the starting and end points thereof). For example, as shown in FIG. 19(*a*), the point of intersection 1906 is obtained of the stop 1905 and a circular arc 1904 which is the locus of movement of the starting point 1903 of the driver 1901 along a reference element 1902. The distance as measured from the starting point 1903 of the driver 1901 to the point of intersection 1906 along the circular arc 1904 is the distance da.

(b) A distance db when the end point of the driver element moves to interfere with the stop element (except for the starting and end points thereof). For example, as shown in FIG. 19(*b*), the point of intersection 1916 is obtained of the stop 1915 and a circular arc 1914 which is the locus of movement of the starting point 1913 of the driver 1911 along a reference element 1912. The distance as measured from the starting point 1913 of the driver 1911 to the point of intersection 1916 along the circular arc 1914 is the distance db.

(c) A distance of movement dc when a point on the driver element (except for the starting and end points thereof) moves to interfere with the starting point of the stop element. For example, when, as shown in FIG. 19(*c*), the driver side element is a line segment, the point of intersection 1929 is obtained of a circular arc 1925 constituting the locus of movement of the starting point 1924 of the element 1923 when the driver 1921 moves along the reference element 1922 and a straight line 1928 which passes the starting point 1927 of the stop 1926 and which is parallel to the element 1923 of the driver 1921. The distance as measured from the starting point 1924 of the driver 1921 to the point of intersection 1929 along the circular arc 1925 is the distance dc.

Figure 20A:
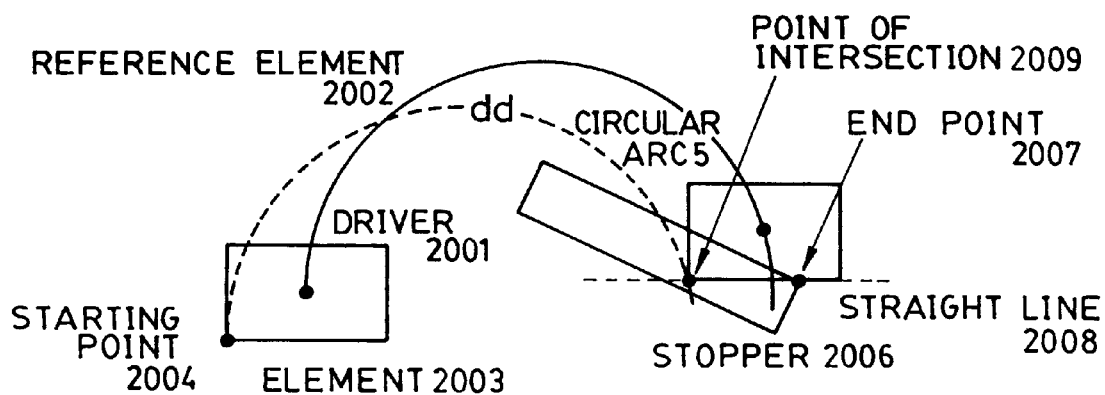
FIGS. 20(a) and 20(b) are diagrams illustrating the calculation of another translation along an interference element.
Figure 20B:
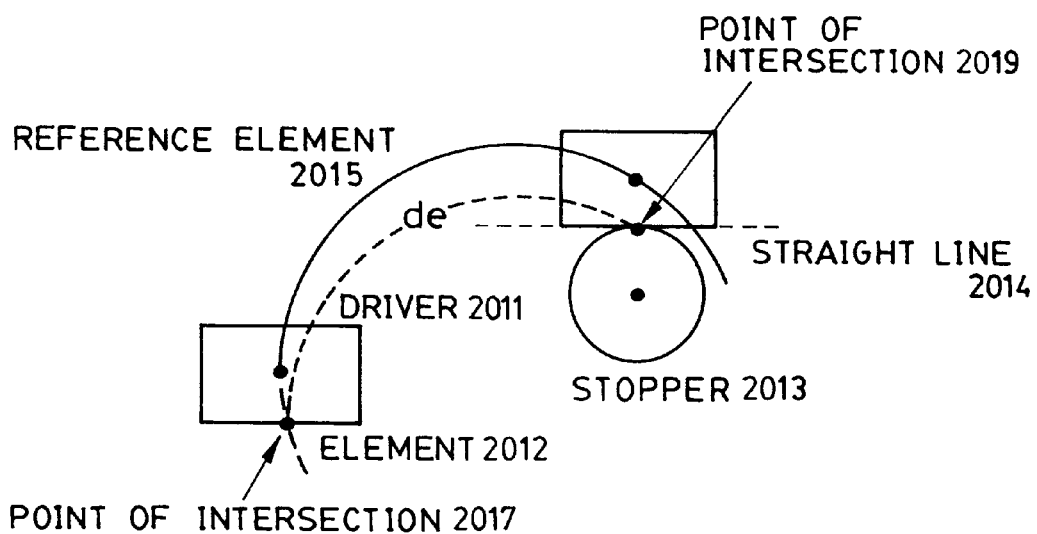

(d) A distance dd when a point on an element on the driver side (except for the starting and end points thereof) moves to interfere with the end point of an element on the stop side. For example, when, as shown in FIG. 20(*a*), the driver side element is a line segment, the point of intersection 2009 is obtained of a circular arc 2005 which is the locus of movement of the starting point 2004 of the element 2003 when the driver 2001 moves along the reference element 2002 and a straight line 2008 which passes the end point 2007 of the stop 2006 and which is parallel to the element 2003 of the driver 2001. The distance as measured from the starting point 2004 of the driver 2001 to the point of intersection 2009 along the movement locus circular arc 2005 is the distance dd.

(e) A distance of movement de when a point on an element on the driver side (except for the starting and end points thereof) moves to interfere with a point on an element on the stop side (except for the start and end points thereof). For example, when, as shown in FIG. 20(*b*), the driver side element is a line segment and the stop side element is a circular arc, the point of intersection 2016 of a reference element 2015 and a straight line 2014 which is parallel to the element of the driver 2011 and connected to the stop 2013 is obtained as well as the point of intersection 2017 of the element 2012 and the reference element 2015. The distance as measured from the point of intersection 2017 to the point of intersection 2016 along the reference element 2015 is the distance de.

Interference calculation is performed with respect to all the combinations of the interference elements on both the driver and stop sides and for all the cases of the above (a) through (c). However, the above (a) through (c) includes a case where it is impossible to obtain a distance of interference. Of all the distances of interference obtained, the minimum one is the amount of movement in the interference translation.

When, in the interference calculation in the kinematic-simulation system, the driver and stop interfere with each other prior to the calculation, the driver is translated to move to a position where it does not interfere with the stop, and then the interference calculation is conducted. This will be explained in detail below.

Figure 14:
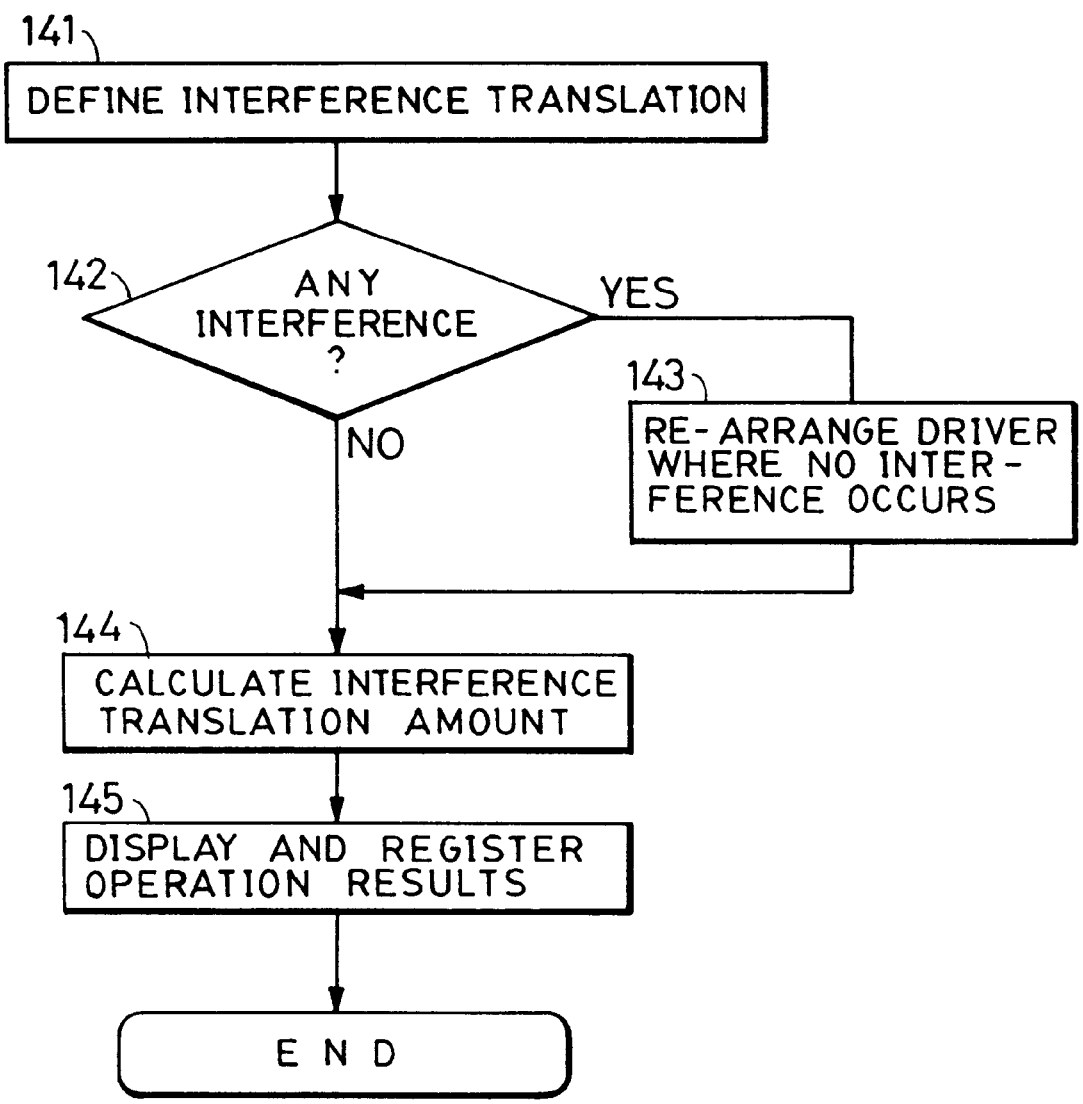
FIG. 14 is a bypass flowchart for an interference translation.

FIG. 14 illustrates in detail the interference translation step 11, showing a bypass process in the interference translation.

In interference translation defining step 141, an interference translation is designated. When an interference translation is designated, a judgment is made in interference judging step 142 as to whether the driver and the stop are interfering with each other, on the basis of positional information. When the driver and the stop are interfering with each other, the driver is re-arranged, in re-arranging step 143, at a position where it does not interfere with the stop. In interference translation calculating step 4, the amount of movement when the driver is translated until it interferes with the stop. In step 145, the driver is translated in accordance with the amount of movement calculated in the interference translation calculating step 144 and is re-displayed, the translation results being stored in memory.

When, in the interference translation step 11, the driver and the stop are already interfering with each other prior to the calculation, a movement is effected by a correction movement amount (ddis) in a direction that is the reverse of the translating direction so as to move the driver repeatedly within the range of a total correction movement amount (ddmax) up to a position where it does not interfere with the stop, and then the above-described interference rotation calculation is conducted. After a return (bypass) movement, the above-described interference translation calculation is conducted.

If an appropriate arrangement cannot be effected within the total correction movement amount, the interval of the correction movement amount is corrected, and then a correction movement is conducted again.

When the number of times of the correction of the movement amount has exceeded a designated number of times. (mmov), or when the interval of the correction movement amount has become smaller than the minimum correction amount (ddmin), it is decided that correction is impossible, and no operation is conducted.

The above ddis, ddmax, ddmin and mmov can be set beforehand in the storage device 20 by using the input device 19, and they need not be set for each new operation. When the above ddis, dmax, ddmin and mmov are not set, standard values prescribed by the system are set.

Figure 15:
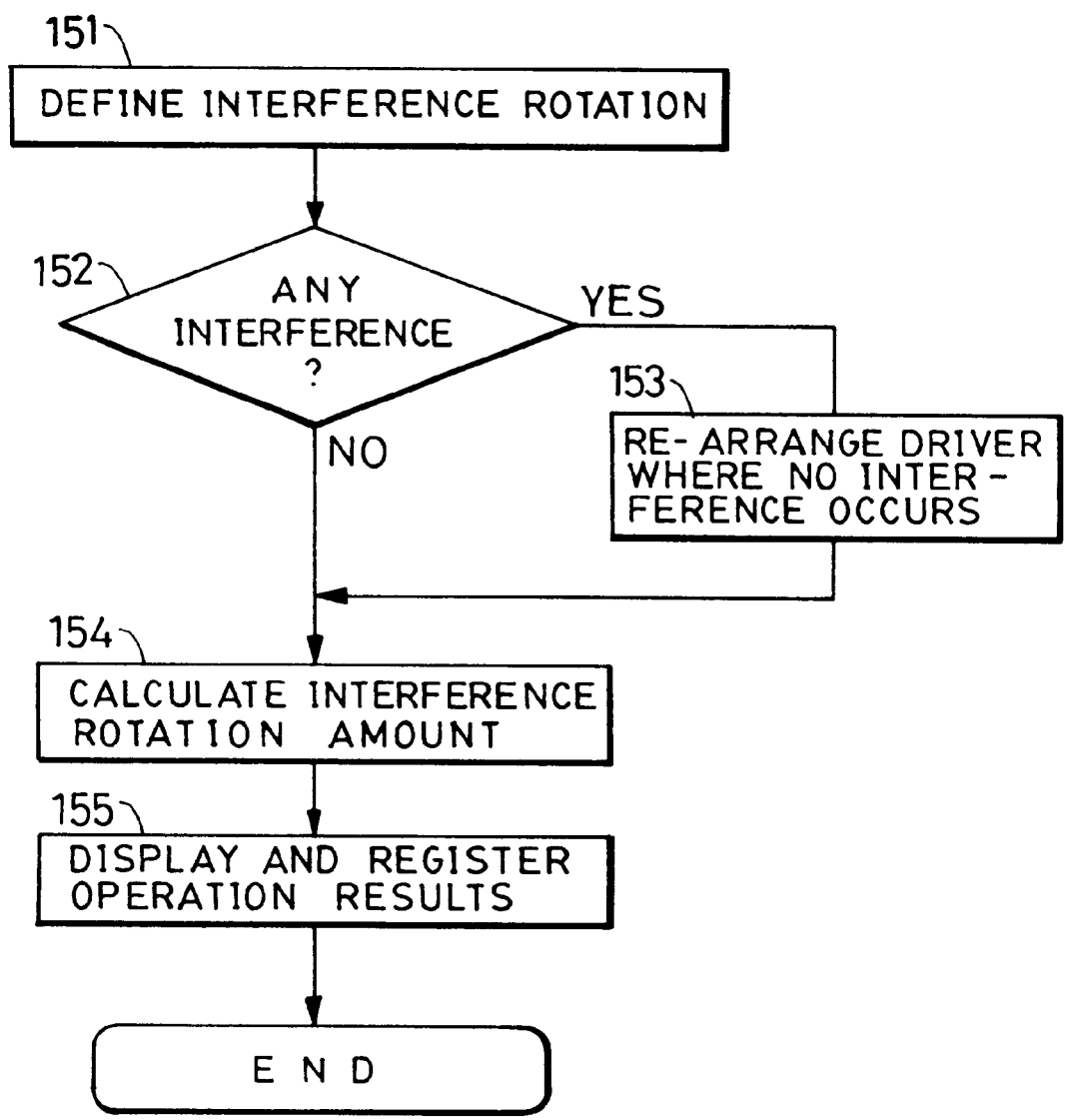
FIG. 15 is a bypass flowchart for an interference rotation.

FIG. 15 illustrates in detail the interference rotation step 13, showing a bypass process in the interference rotation. This will be described below.

In an interference rotation defining step 151, an interference rotation is designated. When an interference rotation is designated, a judgment is made in interference judging step 152 as to whether the driver is interfering with the stop. When the driver is interfering with the stop, the driver is re-arranged, in re-arranging step 153, at a position where it does not interfere with the stop. In interference rotation calculating step 154, the rotation angle by which the driver is rotated to come into contact with the stop is calculated, and the calculated results are stored in memory. Then, in translation result display/register step 155, the driver is rotated in accordance with the rotation angle calculated in the interference rotation calculating step 154 and is re-displayed.

When, in the interference rotation calculation step 154, the driver and the stop already interfere with each other prior to the calculation, a rotation is effected in the direction reverse to the direction of rotation by a correction rotation amount (dthe); after repeated rotation within the total correction rotation (dtmax) up to a position where the driver does not interfere with the stop, the above-described interference rotation calculation is conducted.

If an appropriate arrangement cannot be effected with the total correction rotation angle, the interval of the correction rotation angle is corrected, and then the correction rotation is effected again.

If the number of times of the correction of the correction movement amount has exceeded a number of times (mrot), or if the interval of the correction rotation angle has become smaller than the minimum correction angle (dtmin), any correction is regarded as impossible and no operation is performed.

dthe, dtmax, dtmin and mrot can be set beforehand in the storage device 20 by using the input device 19, so they need not be set for each operation. When dthe, dtmax, dtmin and mrot are not specially set, standard values as prescribed by the system are set.

By the above processes, it is possible to simulate the operation of a mechanism in which cams, links, etc. are combined with each other.

Although a kinematic simulation has been so far described with respect to a two-dimensional CAD figure, the system configuration of this embodiment also enables a kinematic simulation for a three-dimensional CAD figure.

The kinematic simulation for a three-dimensional CAD figure is different from that for a two-dimensional CAD figure in that the coordinates and vectors used therein are of three dimensions. Further, an axis of rotation is designated as a center of rotation, and the types of elements which can be designated include surfaces and solids.

Next, a mechanism arrangement status processing apparatus will be described. In a mechanism arrangement status processing apparatus, an identifier is imparted to the status of arrangement of a part at an arbitrary point in time, thereby defining the status of arrangement (hereinafter referred to as "status") at that point in time and enabling register and return operations.

Status information consists of part identifier and part positional information. Referring to FIG. 7(a), which shows figure data, designating the menu STAT causes a change to a menu for status handling, and a set-status list is displayed on the display device 18. By designating the menu STORE and entering a status identifier, a status is defined. By designating the menu LOAD and inputting the status identifier, it is possible to return to the defined status.

FIG. 13 schematically shows a mechanism arrangement status processing method.

Referring to FIG. 13, numeral 131 indicates a status processing method selecting step, where either registering or returning is designated by using the input device 19 (a mouse, a keyboard or the like).

In a status processing method judging step 132, the central processing unit 17 allocates the process to be executed next in accordance with the processing method designated in step 131. When registering has been designated, a status registering process is executed. When returning has been designated, a status return process is executed.

In a status identifier input step 133, the identifier of the status to be registered is designated by using the input device 19 consisting of a mouse, a keyboard or the like.

In a status registering step 134, the current status information is registered in the storage device 20. The status information consists of a part identifier and a part positional information. Accordingly, information on each element constituting a part is not registered in the storage device 20, thus reducing the amount of information to be stored.

In a return status selecting step 135, the identifier of the status to which return is to be effected is designated by using the input device, a mouse, a keyboard or the like, with the identifier input in step 133 being displayed on the display device 18.

In a return status reading step 136, information regarding the return status is read from the storage device 20. Due to the reduction in the amount of information read, effected in step 134, the reading process can be conducted at high speed.

In a status display step 137, the information read in step 136 is displayed on the display device 18. As in step 136, due to the reduction in the amount of information read, effected in step 134, the display process can be performed at high speed.

As described above, the present invention provides a kinematic-simulation apparatus including: a translation type selecting unit for selecting a translation type; a translation type judging unit for judging a defined translation type; translation defining unit for defining an interference translation mode when an interference translation is selected; an interference translation amount calculating unit for calculating an interference translation amount when an interference translation is selected and an interference translation mode is defined; an interference rotation angle defining unit for defining an interference rotation mode when an interference rotation is selected; an interference rotation amount calculating unit for calculating an interference rotation amount when an interference rotation is selected and an interference rotation mode is defined; and a translation result register unit for changing the arrangement of a figure associated with an operation by a calculated translation amount and re-displaying the same. This apparatus make it possible to easily simulate a behavior of mechanical systems with an information processing system, such as a CAD system, by a method including: selecting a translation type; judging a defined translation type; defining an interference translation mode when an interference translation is selected; calculating an interference translation amount when an interference translation is selected and an interference translation mode is defined; defining an interference rotation mode when an interference rotation is selected; calculating an interference rotation amount when an interference rotation is selected and an interference rotation mode is defined; and changing the arrangement of a figure associated with the translation by a calculated translation amount and re-displaying the same.

Further, as described above, the present invention provides a kinematic-simulation method comprising: a translation type selecting step in which a translation type is selected; a translation type judging step in which a defined translation type is judged; an interference translation defining step in which an interference translation mode is defined when an interference translation is selected; an interference translation amount calculating step in which an interference translation amount is calculated when an interference translation is selected and an interference translation mode is defined; an interference rotation angle defining step in which an interference rotation mode is defined when an interference rotation is selected; an interference rotation amount calculating step in which an interference rotation amount is calculated when an interference rotation is selected and an interference rotation mode is defined; and a translation result display/register step in which the arrangement of a figure associated with the operation is changed by a calculated translation amount and re-displayed. This method makes it possible to easily simulate a behavior of mechanical systems with an information processing system, such as a CAD system, by selecting a translation type, judging a defined translation type, defining an interference translation mode when an interference translation is selected, calculating an interference translation amount when an interference translation is selected and an interference translation mode is defined, defining an interference rotation mode when an interference rotation is selected, calculating an interference rotation amount when an interference rotation is selected and an interference rotation mode is defined, and changing the arrangement of a figure associated with the translation by a calculated translation amount and re-displaying the same.

What is claimed is:

1. Apparatus controlled by signals from a computer readable medium comprising:

translation type selecting means for selecting a translation type from among a plurality of translation types displayed on a display means;

translation amount defining means for defining an object of an interference translation when an interference translation is selected;

interference translation amount calculating means for calculating an interference translation amount when an interference translation is selected and an interference translation mode is defined, the interference translation amount being the amount of translation required until the start of interference with the object of the interference translation;

interference rotation angle defining means for defining an object of an interference rotation when an interference rotation is selected;

interference rotation amount calculating means for calculating an interference rotation amount when an interference rotation is selected and an interference rotation mode is defined, the interference rotation amount being the amount of rotation required until the start of interference with the object of the interference rotation; and translation result display means for changing an arrangement of a figure associated with an operation by the calculated interference translation amount or the calculated interference rotation amount, and for re-displaying the figure with its arrangement changed.

2. A method performed by a programmable apparatus according to signals from a computer readable medium comprising:

a translation type selecting step in which a translation type is selected from among a plurality of translation types displayed on a display means;

a translation amount defining step in which an object of an interference translation is defined when an interference translation is selected;

an interference translation amount calculating step in which an interference translation amount is calculated when an interference translation is selected and an interference translation mode is defined, the interference translation amount being the amount of translation required until the start of interference with the object of the interference translation;

an interference rotation angle defining step in which an object of an interference rotation is defined when an interference rotation is selected;

an interference rotation amount calculating step in which an interference rotation amount is calculated when an interference translation is selected and an interference rotation mode is defined, the interference rotation amount being the amount of rotation required until the start of interference with the object of the interference rotation; and a translation result displaying step in which an arrangement of a figure associated with an operation is changed by the calculated interference translation amount or the calculated interference rotation amount, and is redisplayed.

3. Apparatus controlled by signals from a computer readable medium according to claim 1 further comprising:

interference-translation-along-element amount defining means for defining an object of an interference-translation-along-element when an interference translation along an element is selected; and interference-translation-along-element amount calculating means for calculating an interference translation amount when the interference translation along an element is selected and an interference-translation-along-element mode is defined.

4. A method performed by a programmable apparatus according to signals from a computer readable medium according to claim 2 further comprising:

an interference-translation-along-element amount defining step in which an object of an interference-translation-along-element is defined when an interference translation along an element is selected; and an interference-translation-along-element amount calculating step in which an interference translation amount is calculated when the interference translation along an element is selected and an interference-translation-along-element mode is defined.

5. Apparatus controlled by signals from a computer readable medium according to claim 3 further comprising:

translation defining means for defining an object of a translation when a translation is selected;

translation amount calculating means for calculating a translation amount when the translation is selected and a translation mode is defined;

rotation defining means for defining an object of a rotation when a rotation is selected;

rotation amount calculating means for calculating a rotation amount when the rotation is selected and a rotation mode is defined;

translation-along-element defining means for defining an object of a translation-along-element when a translation along an element is selected;

translation-along-element amount calculating means for calculating a translation amount when the translation along an element is selected and a translation-along-element mode is defined.

6. A method performed by a programmable apparatus according to signals from a computer readable medium according to claim 4 further comprising:

a translation defining step in which an object of a translation is defined when a translation is selected;

a translation amount calculating step in which a translation amount is calculated when the translation is selected and a translation mode is defined;

a rotation defining step in which an object of a rotation is defined when a rotation is selected;

a rotation amount calculating step in which a rotation amount is calculated when the rotation is selected and a rotation mode is defined;

a translation-along-element defining step in which an object of a translation-along-element is defined when a translation along an element is selected; and a translation-along-element amount calculating step in which a translation amount is calculated when the translation along an element is selected and the translation-along-element mode is selected.

7. Apparatus controlled by signals from a computer readable medium comprising:

interference-translation-along-element designating means for designating an interference translation along an element;

displaying means for displaying an icon which is selected by said interference-translation-along element designating means;

driver designating means for designating a driver;

reference element designating means for designating a reference element;

movement-start reference position designating means for designating a movement-start reference position;

driver movement direction designating means for designating a direction of movement of the driver;

stop designating means for designating a stop;

interference-translation-along element calculating means for calculating an interference translation along an element;

display/register means for operating the driver in accordance with calculated results obtained by the interference-translation-along-element calculating means and for displaying and registering the same;

interference range designating means for designating an interference range with respect to at least one of the driver designating means and the stop designating means; and interference-translation-along-element calculating means for calculating an interference translation along an element with respect to the designated interference range.

8. A method performed by a programmable apparatus according to signals from a computer readable medium comprising:

an interference-translation-along-element designating step in which an interference translation along an element is designated;

a displaying step for displaying an icon which is selected in the interference-translation-along-element designating step;

a driver designating step in which a driver is designated;

a reference element designating step in which reference element is designated;

a movement-start reference position designating step in which a movement-start reference position is designated;

a driver movement direction designating step in which a direction of movement of the driver is designated;

a stop designating step in which a stop is designated;

an interference-translation-along-element calculating step in which an interference translation along an element is calculated;

a displaying/registering step in which the driver is translated in accordance with calculated results obtained in the interference-translation-along-element calculating step and is displayed and registered;

an interference range designating step in which an interference range is designated at least with respect to one of the driver designating step and the stop designating step; and an interference-translation-along-element calculating step in which an interference translation along an element is calculated with respect to the designated interference range.

9. Apparatus controlled by signals from a computer readable medium comprising:

interference-translation-along-element designating means for designating an interference translation along an element;

displaying means for displaying an icon which is selected by said interference-translation-along-element designating means;

driver designating means for designating a driver;

reference element designating means for designating a reference element;

movement-start reference position designating means for designating a movement-start reference position;

driver movement direction designating means for designating a direction of movement of the driver;

stop designating means for designating a stop;

interference-translation-along-element calculating means for calculating an interference translation along an element; and display/register means for translating the driver in accordance with calculated results obtained by the interference-translation-along-element calculating means and for displaying and registering the same.

10. A method performed by a programmable apparatus according to signals from a computer readable medium comprising:

an interference-translation-along-element designating step in which an interference translation along an element is designated;

a displaying step for displaying an icon which is selected in said interface-translation-along-element designating step;

a driver designating step in which a driver is designated;

a reference element designating step in which a reference element is designated;

a movement-start reference position designating step in which a movement-start reference position is designated;

a driver movement direction designating step in which a direction of movement of the driver is designated;

a stop designating step in which a stop is designated;

an interference-translation-along-element calculating step in which an interference translation along an element is calculated; and a displaying/registering step in which the driver is translated in accordance with calculated results obtained by interference-translation-along-element calculating means and is displayed and registered.

11. An apparatus comprising:

interference judging means for making a judgment as to whether a defined operational figure displayed on a display device and an interference figure are interfering with each other;

operational figure re-arranging means for rearranging the operational figure at a position where no interference occurs by rotating the operational figure when the operational figure and the interference figure are interfering with each other; and interference rotation amount calculating means for calculating an amount of the rotation, wherein the shapes of the operational figure and the interference figure remain unchanged when the operational figure is rearranged by said re-arranging means.

12. A method performed by a programmable apparatus comprising:

an interference judging step in which a judgment is made whether a defined operational figure displayed on a display device and an interference figure are interfering with each other;

a translational figure re-arranging step in which the operational figure is re-arranged at a position where no interference occurs by rotating the operational figure when the operational figure and the interference figure are interfering with each other; and an interference rotation amount calculating step in which an amount of the rotation is calculated, wherein the shapes of the operational figure and the interference figure remain unchanged when the operational figure is rearranged in said re-arranging step.

13. An apparatus comprising:

processing method selecting means for selecting a mechanism arrangement status processing method displayed on a display device;

processing method judging means for judging an input processing method;

mechanism arrangement status register means for registering a mechanism arrangement status for a mechanism that contains a plurality of elements having fixed shapes, wherein the mechanism arrangement status depends upon positions of the elements, and the shapes of the elements are independent of the positions of the elements; and mechanism arrangement status returning means for reading and displaying the mechanism arrangement status.

14. An apparatus comprising:

interference translation designating means for designating an interference translation, the interference translation designating means instructing a designation by selecting an icon indicated on a display device;

driver designating means for designating a driver;

driver movement direction designating means for designating a direction of movement of the driver;

stop designating means for designating a stop;

interference translation calculating means for calculating an interference translation; and display means for operating the driver in accordance with calculated results obtained by the interference translation calculating means and for displaying the same, wherein the shapes of the driver and the stop remain unchanged when the driver is operated by said display means.

15. A method performed by a programmable apparatus comprising:

an interference translation designating step in which an interference translation is designated, the interference translation designating step instructing a designation by selecting an icon indicated on a display device;

a driver designating step in which a driver is designated;

a driver movement direction designating step in which a direction of movement of the driver is designated;

a stop designating step in which a stop is designated;

an interference translation calculating step in which an interference translation is calculated; and a step in which the driver is translated in accordance with calculated results obtained in the interference translation calculating step and is displayed, wherein the shapes of the driver and the stop remain unchanged as the driver is translated.

16. An apparatus comprising:

interference judging means for making a judgment as to whether a defined operational figure displayed on a display device and an interference figure are interfering with each other;

operational figure re-arranging means for re-arranging a translational figure at a position where no interference occurs by translating the operational figure when the operational figure and the interference figure are interfering with each other; and interference translation amount calculating means for calculating the translation amount, wherein the shapes of the operational figure and the interference figure remain unchanged when the operational figure is rearranged by said re-arranging means.

17. A method performed by a programmable apparatus comprising:

an interference judging step in which a judgement is made whether a defined operational figure displayed on a display device and an interference figure are interfering with each other;

a translational figure re-arranging step in which a translational figure is re-arranged at a position where no interference occurs by translating the operational figure when the operational figure and the interference figure are interfering with each other; and an interference translation amount calculating step in which the interference translation amount is calculated, wherein the shapes of the operational figure and the interference figure remain unchanged when the operational figure is rearranged in said re-arranging step.

18. Apparatus controlled by signals from a computer readable medium comprising:

interference rotation designating means for designating an interference rotation, the interference rotation designating means being selected on a display device;

driver designating means for designating a driver;

rotation center designating means for designating a rotation center;

at least one of rotation direction designating means for designating a direction of rotation and automatic rotation direction setting means for automatically setting a directing of rotation;

stop designating means for designating a stop; interference rotation calculating means for calculating an interference rotation; and interference-rotation-calculation result display means for operating the driver in accordance with calculated results obtained by the interference rotation calculating means and for displaying and registering the same.

19. A method performed by a programmable apparatus according to signals from a computer readable medium comprising;

an interference rotation designating step in which an interference rotation is designated, the interference rotation designating step being selected on a display device;

a driver designating step in which a driver is designated;

a rotation center designating step in which a rotation center is designated;

at least one of a rotation direction designating step in which a direction of rotation is designated and an automatic rotation direction setting step in which a direction of rotation is set automatically;

a stop designating step in which a stop is designated;

an interference rotation calculating step in which an interference rotation is calculated; and an interference-rotation-calculation result display step in which the driver is driven in accordance with calculated results obtained in the interference rotation calculating step and is displayed.

20. Apparatus controlled by signals from a computer readable medium comprising:

interference rotation designating means for designating an interference rotation, the interference rotation designating means being selected on a display device;

driver designating means for designating a driver;

rotation center designating means for designating a rotation center;

at least one of rotation direction designating means for designating a direction of rotation and automatic rotation direction setting means for automatically setting a direction of rotation;

stop designating means for designating a stop;

interference rotation calculating means for calculating an interference rotation;

interference-rotation-calculation result display means for operating the driver in accordance with calculated results obtained by the interference rotation calculating means and for displaying and designating the same; and interference range designating means for designating an interference range in at least one of the driver designating means and the stop designating means.

21. A method performed by a programmable apparatus according to signals from a computer readable medium comprising;

an interference rotation designating step in which an interference rotation is designated, the interference rotation designating step being selected on a display device;

a driver designating step in which a driver is designated;

a rotation center designating step in which a rotation center is designated;

a rotation direction step including at least one of a rotation direction designating step in which a direction of rotation is designated and an automatic rotation direction setting step in which a direction of rotation is set automatically;

a stop designating step in which a stop is designated;

an interference rotation calculating step in which an interference rotation is calculated;

an interference-rotation-calculation result display step in which the driver is driven in accordance with calculated results obtained in the interference rotation calculating step and is displayed and registered; and an interference range designating step in which an interference range is designated in at least one of the driver designating step and the stop designating step.

22. Apparatus controlled by signals from a computer readable medium comprising;

interference translation designating means for designating an interference translation, the interference translation designating means being selected on a display device;

driver designating means for designating a driver;

driver movement direction designating means for designating a direction of movement of the driver;

stop designating means for designating a stop;

interference translation calculating means for calculating an interference translation;

display means for operating the driver in accordance with calculated results obtained by the interference translation calculating means and displaying the same; and interference range designating means for designating an interference range at least with respect to one of the driver designating means and the stop designating means.

23. A method performed by a programmable apparatus according to signals from a computer readable medium comprising:

an interference translation designating step in which an interference translation is designated, the interference translation being selected on a display device;

a driver designating step in which a driver is designated;

a driver movement direction designating step in which a direction of movement of the driver is designated;

a stop designating step in which a stop is designated;

an interference translation calculating step in which an interference translation is calculated;

a display step in which the driver is translated in accordance with calculated results obtained in the interference translation calculating step and is displayed; and an interference range designating step in which an interference range is designated with respect to at least one of the driver designating step and the stop designating step.

* * * * *

UNITED STATES PATENT AND TRADEMARK OFFICE
CERTIFICATE OF CORRECTION

PATENT NO. : 5,945,994

DATED : August 31, 1999

INVENTOR(S): KAZUMA SHIMIZU, ET AL.

It is certified that error appears in the above-identified patent and that said Letters Patent is hereby corrected as shown below:

COLUMN 13:
Line 17, "movement" should read --movement is calculated--.

Signed and Sealed this

Eleventh Day of July, 2000

Attest:

Q. TODD DICKINSON

Attesting Officer          Director of Patents and Trademarks